United States Patent
Dixler et al.

(10) Patent No.: US 10,462,941 B2
(45) Date of Patent: Oct. 29, 2019

(54) HEAT SINK ASSEMBLY

(71) Applicant: Caterpillar Inc., Peoria, IL (US)

(72) Inventors: Keith Elliot Dixler, Peoria, IL (US); Jon Nathaniel Husser, McNabb, IL (US); Allen Ben Chu, Dunlap, IL (US); Todd George Nakanishi, Elwood, IN (US)

(73) Assignee: Caterpillar Inc., Peoria, IL (US)

( * ) Notice: Subject to any disclaimer, the term of this patent is extended or adjusted under 35 U.S.C. 154(b) by 101 days.

(21) Appl. No.: 15/804,484

(22) Filed: Nov. 6, 2017

(65) Prior Publication Data

US 2019/0141864 A1    May 9, 2019

(51) Int. Cl.
    *H05K 7/20*    (2006.01)

(52) U.S. Cl.
    CPC .................. *H05K 7/20927* (2013.01)

(58) Field of Classification Search
    CPC ........ F28D 7/1692; F28D 7/085; F28D 7/087; H05K 7/20927; F28F 3/12
    See application file for complete search history.

(56) References Cited

U.S. PATENT DOCUMENTS

| | | | | |
|---|---|---|---|---|
| 3,604,104 A | * | 9/1971 | Glasgow | B21D 53/08 148/24 |
| 5,645,127 A | * | 7/1997 | Enderle | F02K 1/822 165/168 |
| 8,225,854 B2 | * | 7/2012 | Ippoushi | H01L 23/473 165/176 |
| 8,297,343 B2 | * | 10/2012 | Yang | F28D 7/08 165/104.11 |
| 8,385,068 B2 | | 2/2013 | Jacobson et al. | |
| 8,441,827 B2 | | 5/2013 | Baker et al. | |
| 8,912,645 B2 | | 12/2014 | Kusaka | |
| 9,279,625 B2 | * | 3/2016 | Nakanishi | H05K 7/20927 |
| 9,504,186 B2 | | 11/2016 | Dixler et al. | |
| 10,158,151 B2 | * | 12/2018 | Kenney | H01M 10/625 |
| 2002/0195234 A1 | * | 12/2002 | Wu | F25B 39/022 165/144 |
| 2010/0254081 A1 | | 10/2010 | Koenig et al. | |
| 2012/0125573 A1 | | 5/2012 | Rubenstein et al. | |
| 2014/0334095 A1 | | 11/2014 | Suzuki et al. | |

(Continued)

FOREIGN PATENT DOCUMENTS

| | | |
|---|---|---|
| CN | 201252706 | 6/2009 |
| CN | 103426829 | 9/2015 |

(Continued)

*Primary Examiner* — Tho V Duong

(57) ABSTRACT

A heat sink assembly for a power module is provided. The assembly includes a main body having a first cooling circuit and a second cooling circuit. The first cooling circuit includes a first plurality of channels, at least one first end channel, at least one second end channel, a first inlet, and a first outlet. The first cooling circuit is adapted to provide a first flow of a coolant through the main body. The second cooling circuit includes a second plurality of passages, at least one first end passage, at least one second end passage, a second inlet, and a second outlet. The second cooling circuit is adapted to provide a second flow of the coolant through the main body. The first cooling circuit and second cooling circuit is adapted to provide a cross flow of the first flow and second flow through the main body respectively.

18 Claims, 16 Drawing Sheets

(56) References Cited

U.S. PATENT DOCUMENTS

2015/0116938 A1 4/2015 Nakanishi et al.
2015/0146376 A1 5/2015 Taguchi

FOREIGN PATENT DOCUMENTS

| CN | 103441110 | 5/2016 |
| JP | 2006351561 | 12/2006 |
| JP | 2011177004 | 9/2011 |
| JP | 2013247354 | 12/2013 |
| KR | 101674466 | 11/2016 |
| WO | 2017047825 | 3/2017 |

* cited by examiner

HEAT SINK ASSEMBLY

TECHNICAL FIELD

The present disclosure relates to a heat sink assembly. More particularly, the present disclosure relates to the heat sink assembly for one or more power modules associated with an electronic electrical system.

BACKGROUND

A device commonly referred to as a power converter is often used in electrical systems and/or power electronic systems. The power converter may receive electrical power from an electrical power source, condition the electrical power, and supply the conditioned electrical power to one or more electrically powered devices. During use, the power converter may generate undesired heat. Dissipating the heat generated by the power converter may improve an efficiency thereof and may limit premature damage and/or degradation of components thereof.

In one situation, the power converter may employ an air cooling system, such as a fan based cooling system, in order to direct cooling air over the components thereof to dissipate the generated heat. However, the air cooling system may have a lower cooling efficiency and may require high air flow rates for achieving a desired heat dissipation rate. Also, the air cooling system may be impractical in some environments, such as, a dusty environment, a high moisture environment, and/or the like.

In another situation, a fluid cooling system may be employed such that a coolant may be circulated through or past a heat sink. The heat sink may be provided in thermal contact with the components of the power converter in order to dissipate the generated heat therefrom. In such a fluid cooling system, the coolant may enter the heat sink at one end thereof and may exit the heat sink at another end thereof. However, during circulation of the coolant through the heat sink, the coolant may collect heat and may attain a higher temperature much before exiting the heat sink.

For example, the coolant having a low temperature may enter the heat sink and during circulation thereof within the heat sink, the coolant may attain the high temperature within an initial portion or around a mid-portion of the heat sink. As a result, the coolant may continue to be circulated with the high temperature through a remaining or latter portion of the heat sink. In such a situation, the heat sink and the power converter may experience an undesired thermal gradient during use.

The thermal gradient may result in premature failure of the components of the power converter, overheating of the junction due to poor current sharing, failure due to loss of gate control, premature wear out due to expansion fatigue, and/or the like. Also, the fluid cooling system may present various mechanical and structural challenges related to packaging of the components compactly while still allowing for a required heat dissipation rate. Hence, there is a need for an improved heat transfer mechanism for such electrical components and systems.

U.S. Pat. No. 9,279,625 describes a heat sink for power modules of a machine. The heat sink includes a body having a plurality of divider webs integral thereto and defining a plurality of longitudinal passage segments within the body. The body is machined to remove alternating end portions of the divider webs to define a fitting end turn area and a return end turn area disposed in opposing relationship with each other, thereby forming a serpentine fluid passage. A fitting end cap is welded to the body. A fluid inlet and a fluid outlet of the fitting end cap are respectively in fluid communication with a passage inlet and a passage outlet of the serpentine fluid passage.

SUMMARY OF THE DISCLOSURE

In an aspect of the present disclosure, a heat sink assembly for a power module is provided. The heat sink assembly includes a main body having a first end and a second end. The second end is longitudinally opposite the first end. The heat sink assembly also includes a first cooling circuit disposed within the main body. The first cooling circuit is adapted to provide a first flow of a coolant through the main body. The first cooling circuit includes a first plurality of passages disposed within the main body and extending between the first end and the second end of the main body. Each of the first plurality of passages is parallel to and spaced apart with respect to one another. The first cooling circuit includes at least one first end channel disposed within the main body at the first end of the main body. The at least one first end channel is adapted to provide fluid communication between each of the first plurality of passages at the first end of the main body. The first cooling circuit includes at least one second end channel disposed within the main body at the second end of the main body. The at least one second end channel is adapted to provide fluid communication between each of the first plurality of passages at the second end of the main body. The first cooling circuit also includes a first inlet provided in fluid communication with one of the first plurality of passages at the second end of the main body. The first cooling circuit further includes a first outlet provided in fluid communication with one of the first plurality of passages at the second end of the main body. The first outlet is spaced apart with respect to the first inlet. The heat sink assembly further includes a second cooling circuit disposed within the main body. The second cooling circuit is adapted to provide a second flow of the coolant through the main body. The second cooling circuit includes a second plurality of passages disposed within the main body and extending between the first end and the second end of the main body. Each of the second plurality of passages is parallel to and spaced apart with respect to one another and with respect to each of the first plurality of passages. The second cooling circuit includes at least one first end passage disposed within the main body at the first end of the main body. The at least one first end passage is spaced apart with respect to the at least one first end channel. The at least one first end passage is adapted to provide fluid communication between each of the second plurality of passages at the first end of the main body. The second cooling circuit includes at least one second end passage disposed within the main body at the second end of the main body. The at least one second end passage is spaced apart with respect to the at least one second end channel. The at least one second end passage is adapted to provide fluid communication between each of the second plurality of passages at the second end of the main body. The second cooling circuit also includes a second inlet provided in fluid communication with one of the second plurality of passages at the second end of the main body. The second inlet is adjacent to and spaced apart with respect to the first outlet. The second cooling circuit further includes a second outlet provided in fluid communication with one of the second plurality of passages at the second end of the main body. The second outlet is adjacent to and spaced apart with respect to the first inlet. The first cooling circuit and the second cooling circuit provide an opposing cross flow of the first flow and the second flow through the main body respectively.

In another aspect of the present disclosure, a heat sink assembly for a power module is provided. The heat sink assembly includes a main body having a first end and a second end. The second end is longitudinally opposite the first end. The main body includes a first plurality of passages extending between the first end and the second end of the main body. Each of the first plurality of passages is parallel to and spaced apart with respect to one another. The main body includes a second plurality of passages extending between the first end and the second end of the main body. Each of the second plurality of passages is parallel to and spaced apart with respect to one another and with respect to each of the first plurality of passages. The main body includes a first inlet provided in fluid communication with one of the first plurality of passages at the second end of the main body. The main body includes a first outlet provided in fluid communication with one of the first plurality of passages at the second end of the main body. The first outlet is spaced apart with respect to the first inlet. The main body also includes a second inlet provided in fluid communication with one of the second plurality of passages at the second end of the main body. The second inlet is adjacent to and spaced apart with respect to the first outlet. The main body further includes a second outlet provided in fluid communication with one of the second plurality of passages at the second end of the main body. The second outlet is adjacent to and spaced apart with respect to the first inlet. The heat sink assembly also includes a first insert adapted to be coupled to the first end of the main body. The first insert includes at least one first end channel adapted to provide fluid communication between each of the first plurality of passages at the first end of the main body. The first insert also includes at least one first end passage spaced apart with respect to the at least one first end channel. The at least one first end passage is adapted to provide fluid communication between each of the second plurality of passages at the first end of the main body. The heat sink assembly further includes a second insert adapted to be coupled to the second end of the main body. The second insert includes at least one second end channel adapted to provide fluid communication between each of the first plurality of passages at the second end of the main body. The second insert includes at least one second end passage spaced apart with respect to the at least one second end channel. The at least one second cud passage is adapted to provide fluid communication between each of the second plurality of passages at the second end of the main body. The second insert also includes a fluid inlet adapted to provide fluid communication with each of the first inlet and the second inlet. The second insert further includes a fluid outlet adapted to provide fluid communication with each of the first outlet and the second outlet. The first inlet, the first plurality of passages, the at least one first end channel, the at least one second end channel, and the first outlet define a first cooling circuit. The second inlet, the second plurality of passages, the at least one first end passage, the at least one second end passage, and the second outlet define a second cooling circuit. The first cooling circuit and the second cooling circuit provide a cross flow of a first flow of a coolant and a second flow of the coolant through the main body respectively.

In yet another aspect of the present disclosure, a heat sink assembly for a power converter device is provided. The heat sink assembly includes a main body having a first end and a second end. The second end is longitudinally opposite the first end. The heat sink assembly also includes a first cooling circuit disposed within the main body. The first cooling circuit is adapted to provide a first flow of a coolant through the main body. The first cooling circuit includes a first plurality of passages disposed within the main body and extending between the first end and the second end of the main body. Each of the first plurality of passages is parallel to and spaced apart with respect to one another. The first cooling circuit includes at least one first end channel disposed within the main body at the first end of the main body. The at least one first end channel is adapted to provide fluid communication between each of the first plurality of passages at the first end of the main body. The first cooling circuit includes at least one second end channel disposed within the main body at the second end of the main body. The at least one second end channel is adapted to provide fluid communication between each of the first plurality of passages at the second end of the main body. The first cooling circuit also includes a first inlet provided in fluid communication with one of the first plurality of passages at the second end of the main body. The first cooling circuit further includes a first outlet provided in fluid communication with one of the first plurality of passages at the second end of the main body. The first outlet is spaced apart with respect to the first inlet. The heat sink assembly further includes a second cooling circuit disposed within the main body. The second cooling circuit is adapted to provide a second flow of the coolant through the main body. The second cooling circuit includes a second plurality of passages disposed within the main body and extending between the first end and the second end of the main body. Each of the second plurality of passages is parallel to and spaced apart with respect to one another and with respect to each of the first plurality of passages. The second cooling circuit includes at least one first end passage disposed within the main body at the first end of the main body. The at least one first end passage is spaced apart with respect to the at least one first end channel. The at least one first end passage is adapted to provide fluid communication between each of the second plurality of passages at the first end of the main body. The second cooling circuit includes at least one second end passage disposed within the main body at the second end of the main body. The at least one second end passage is spaced apart with respect to the at least one second end channel. The at least one second end passage is adapted to provide fluid communication between each of the second Plurality of passages at the second end of the main body. The second cooling circuit also includes a second inlet provided in fluid communication with one of the second plurality of passages at the second end of the main body. The second inlet is adjacent to and spaced apart with respect to the first outlet. The second cooling circuit further includes a second outlet provided in fluid communication with one of the second plurality of passages at the second end of the main body. The second outlet is adjacent to and spaced apart with respect to the first inlet. The first cooling circuit and the second cooling circuit provide an opposing cross flow of the first flow and the second flow through the main body respectively.

Other features and aspects of this disclosure will be apparent from the following description and the accompanying drawings.

DETAILED DESCRIPTION

Figure 1:
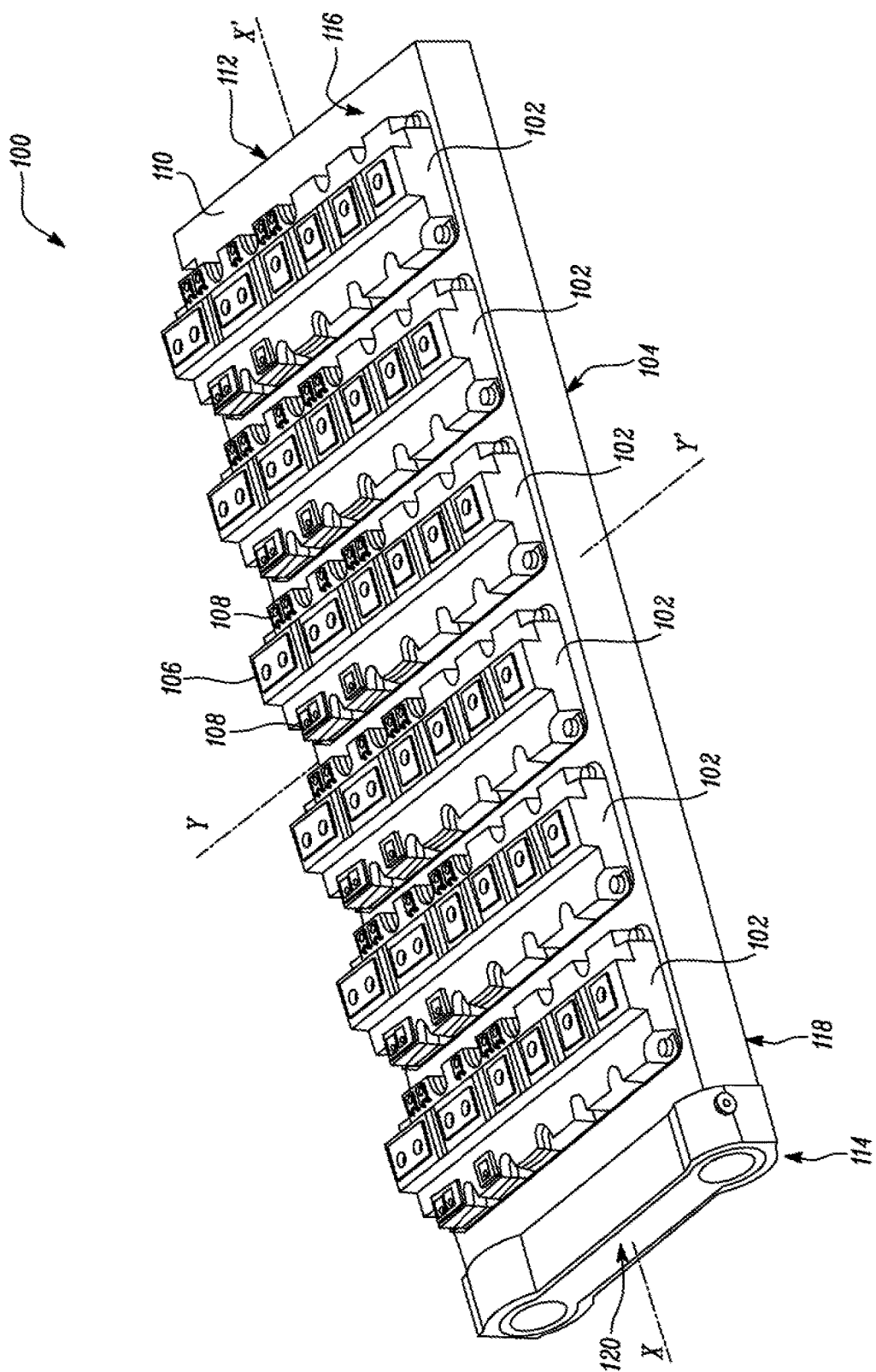
FIG. 1 is a perspective view of a portion of a power converter device having a heat sink assembly, according to an embodiment of the present disclosure.

Wherever possible, the same reference numbers will be used throughout the drawings to refer to the same or the like parts. Referring to FIG. 1, a portion of an exemplary power converter device 100 is illustrated. The power converter device 100 includes multiple power modules 102 mounted on a heat sink assembly 104. The heat sink assembly 104 will be hereinafter interchangeably referred to as "the assembly 104". Each of the power modules 102 is disposed on the assembly 104 substantially parallel to and spaced apart with respect to one another. In some embodiments, each of the power modules 102 may be disposed on the assembly 104 in any other configuration.

Each of the power modules 102 may be electrically connected to other components (not shown) of the power converter device 100, such as a capacitor module, an input power module, an output power module, and/or the like. As illustrated in FIG. 1, the power converter device 100 includes six power modules 102 mounted on the assembly 104. In some embodiments, the power converter device 100 may include any number of power modules 102 mounted on the assembly 104. Each of the power modules 102 includes a configuration similar to one another. Accordingly, each of the power modules 102 includes a cover 106.

The cover 106 is adapted to enclose one or more internal components (not shown) of the respective power module 102, such as one or more electronic chips, substrate, base plate, and/or the like. Each of the power modules 102 also include one or more terminals 108. The terminals 108 are adapted to electrically connect the respective power modules 102 to the other components of the power converter device 100.

Each of the power modules 102 may be mounted on the assembly 104 using a thermal interface (not shown) between the assembly 104 and the power module 102, such as a thermal grease, a thermal pad, and/or the like. Additionally, or alternatively, each of the power modules 102 may be removably mounted on the assembly 104 using one or more fastening elements (not shown), such as screws, bolts, clips, clamps, and/or the like, it should be noted that, in some embodiments, the configuration of one or more of the power modules 102 may vary with respect to the configuration of other power modules 102.

In some embodiments, the power modules 102 and the assembly 104 may be associated with the power converter device 100 of a mobile machine (not shown). In such a situation, the power modules 102 and the assembly 104 may be associated with an Integrated Gate Bipolar Transistor (IGBT) module of an electric drive propulsion system (not shown) of the machine. The machine may be associated with any industry including, but not limited to, agriculture, construction, mining, transportation, forestry, aviation, marine, waste management, and material handling. In some embodiments, the power modules 102 and the assembly 104 may be associated with the power converter device 100 of a power generator (not shown), such as a mobile or a stationary electric power generating system. It should be noted that the assembly 104 may be associated with any power electronic system or electric power system.

The assembly 104 includes a main body 110. The main body 110 includes a substantially flat and elongated configuration defining a longitudinal axis X-X' and a transverse axis Y-Y'. The main body 110 includes a first end 112 and a second end 114. The second end 114 is opposite to the first end 112 along the longitudinal axis X-X'. The main body 110 also includes a first surface 116 and a second surface 118 opposite to the first surface 116. Also, each of the first surface 116 and the second surface 118 extends between the first end 112 and the second end 114 of the main body 110.

As illustrated in FIG. 1, each of the power modules 102 is provided on the first surface 116. Additionally, or alternatively, each of the power modules 102 may be provided on the second surface 118. The main body 110 may be manufactured using one or more materials (e.g., any metal or alloy, such as aluminum, copper, steel, and/or the like). The main body 110 may be manufactured using any method, such as extrusion, casting, machining, additive manufacturing, and/or the like.

The assembly 104 includes a second insert 120 provided on the second end 114 of the main body 110. The assembly 104 also includes a first insert 402 (shown in FIG. 4) provided on the first end 112 of the main body 110. More specifically, referring to FIG. 2, the first end 112 of the main body 110 includes a first machined surface 202. The first machined surface 202 is configured to receive the first insert 402 on the first end 112 of the main body 110. The first insert 402 will be explained in more detail later.

Figure 2:
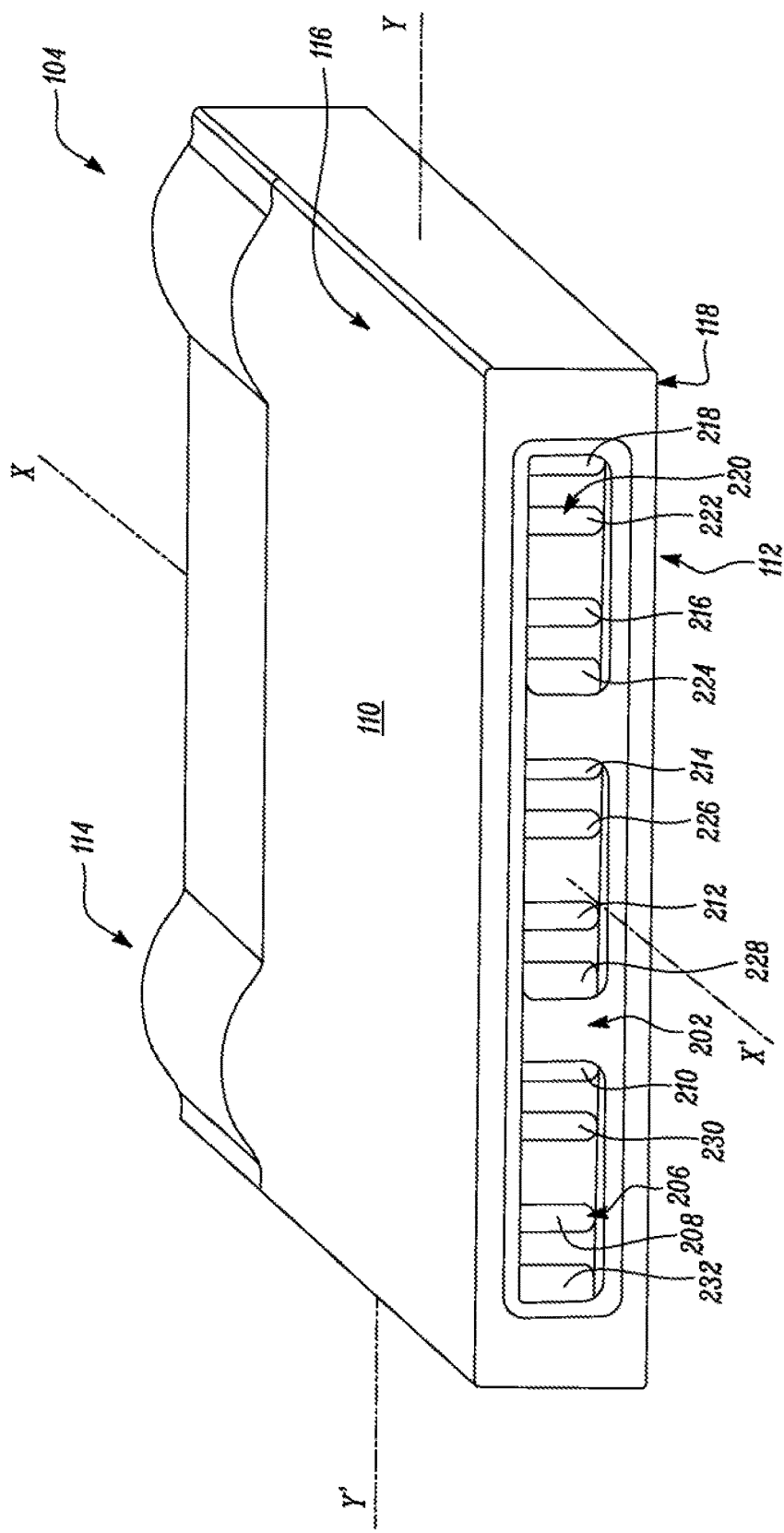
FIG. 2 is a perspective front view of a portion of the heat sink assembly of FIG. 1, according to an embodiment of the present disclosure.

Referring to FIG. 2, the assembly 104 includes a first plurality of passages 206 extending along the longitudinal axis X-X'. More specifically, the first plurality of passages 206 includes a first passage 208, a second passage 210, a third passage 212, a fourth passage 214, a fifth passage 216, and a sixth passage 218. Each of the first, second, third, fourth, fifth, and sixth passage 208, 210, 212, 214, 216, 218 is provided within the main body 110 extending between the first end 112 and the second end 114 of the main body 110. Each of the first, second, third, fourth, fifth, and sixth passage 208, 210, 212, 214, 216, 218 is substantially parallel to and spaced apart with respect to one another along the transverse axis Y-Y'. Each of the first, second, third, fourth, fifth, and sixth passage 208, 210, 212, 214, 216, 218 is substantially parallel to the longitudinal axis X-X'.

Each of the first plurality of passages 206 include a substantially elongated cross-sectional configuration. In some embodiments, one or more of the first plurality of passages 206 may include any other cross-sectional configuration, such as circular, elliptical, rectangular, and/or the like. Also, as illustrated in FIG. 2, the first plurality of passages 206 includes six channels. However, the first plurality of passages 206 may include any number of channels.

The assembly 104 also includes a second plurality of passages 220 extending along the longitudinal axis X-X'. More specifically, the second plurality of passages 220 includes a seventh passage 222, a eighth passage 224, a ninth passage 226, a tenth passage 228, a eleventh passage 230, and a twelfth passage 232. Each of the seventh, eighth, ninth, tenth, eleventh, and twelfth passage 222, 224, 226, 228, 230, 232 is provided within the main body 110 extending between the first end 112 and the second end 114 of the main body 110. Each of the seventh, eighth, ninth, tenth, eleventh, and twelfth passage 222, 224, 226, 228, 230, 232 is substantially parallel to and spaced apart with respect to one another along the transverse axis Y-Y'. Each of the seventh, eighth, ninth, tenth, eleventh, and twelfth passage 222, 224, 226, 228, 230, 232 is substantially parallel to the longitudinal axis X-X'.

Also, each of the seventh, eighth, ninth, tenth, eleventh, and twelfth passage 222, 224, 226, 228, 230, 232 is substantially parallel to and spaced apart with respect to each of the first plurality of passages 206. Each of the second plurality of passages 220 include a substantially elongated cross-sectional configuration. In some embodiments, one or more of the second plurality of passages 220 may include any other cross-sectional configuration, such as circular, elliptical, rectangular, and/or the like.

As illustrated in FIG. 2, the second plurality of passages 220 includes six passages. In some embodiments, the second plurality of passages 220 may include any number of passages. The cross-sectional configuration and area of each of the second plurality of passages 220 is similar to the cross-sectional configuration and area of each of the first plurality of passages 206. In some embodiments, the cross-sectional configuration and/or area of one or more of the second plurality of passages 220 may vary with respect the cross-sectional configuration and/or area of one or more of the first plurality of passages 206 respectively.

The first plurality of passages 206 and the second plurality of passages 220 are arranged in an alternating sequence with respect to one another without contacting one another. For example, the first passage 208 is spaced apart and substantially parallel to the twelfth passage 232 and the eleventh passage 230. The second passage 210 is spaced apart and substantially parallel to the eleventh passage 230 and the tenth passage 228. The third passage 212 is spaced apart and substantially parallel to the tenth passage 228 and the ninth passage 226. The fourth passage 214 is spaced apart and substantially parallel to the ninth passage 226 and the eighth passage 224. The fifth passage 216 is spaced apart and substantially parallel to the eighth passage 224 and the seventh passage 222. The sixth passage 218 is spaced apart and substantially parallel to the seventh passage 222.

Figure 3:
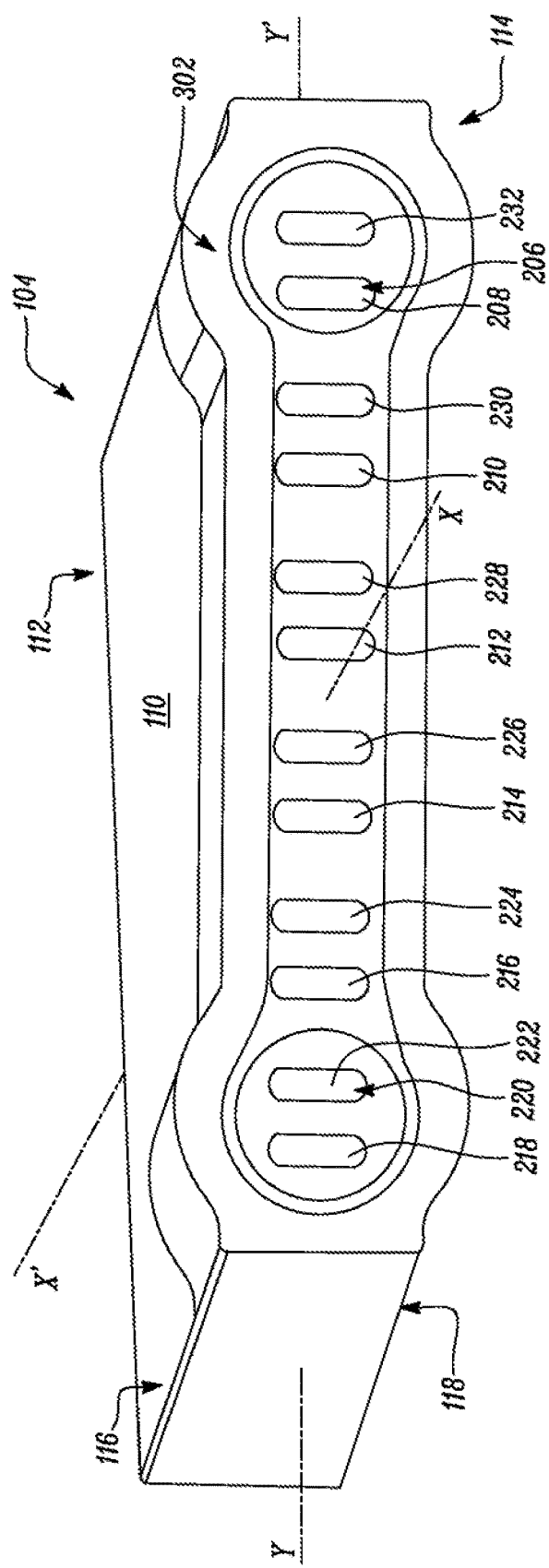
FIG. 3 is a perspective rear view of the portion of the heat sink assembly of FIG. 2, according to an embodiment of the present disclosure.

Referring to FIG. 3, the second end 114 of the main body 110 includes a second machined surface 302. The second machined surface 302 provides to receive the second insert 120 on the second end 114 of the main body 110. The second insert 120 will be explained in more detail later.

Figure 4:
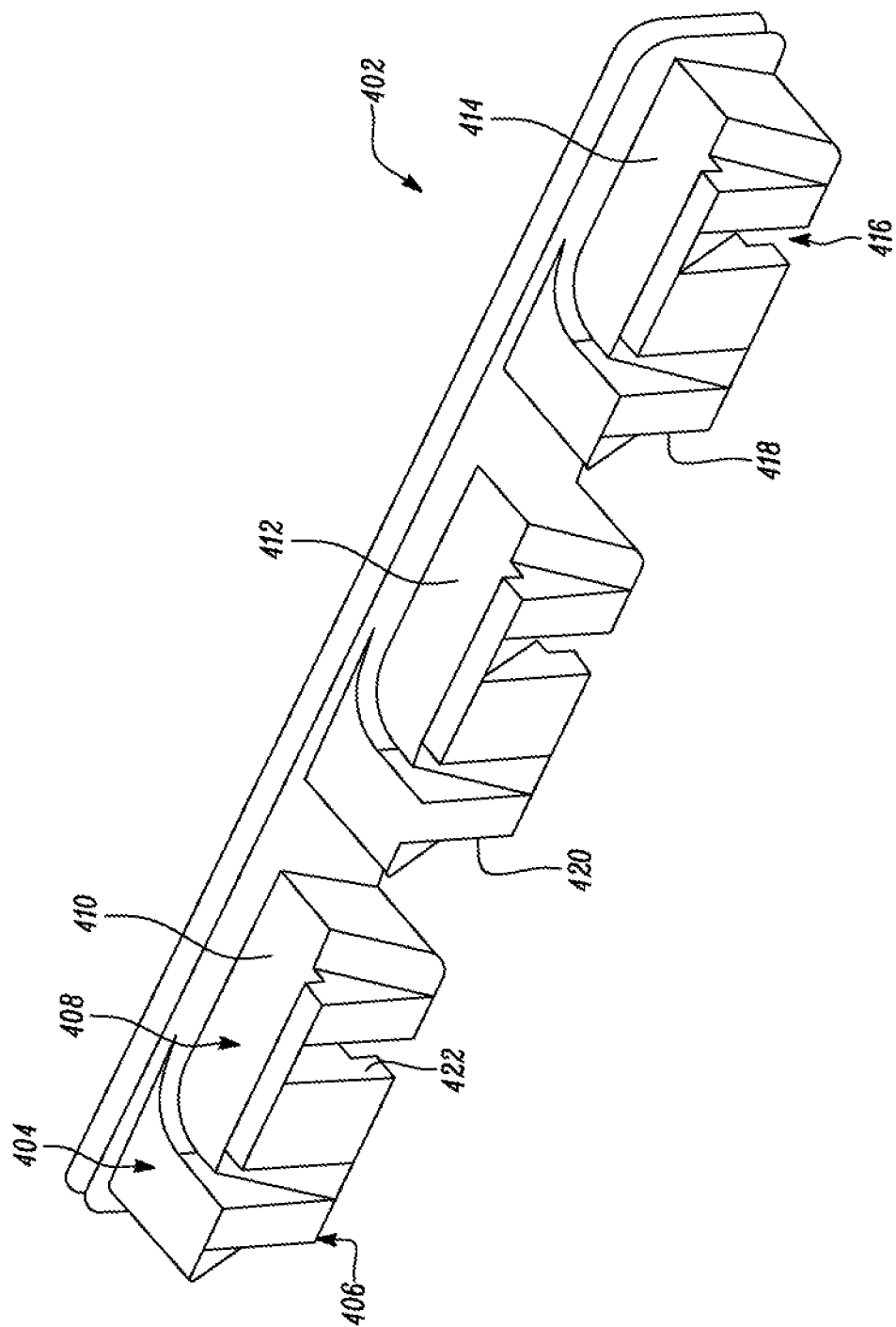
FIG. 4 is a perspective view of a first insert of the heat sink assembly of FIG. 1, according to an embodiment of the present disclosure.
Figure 5:
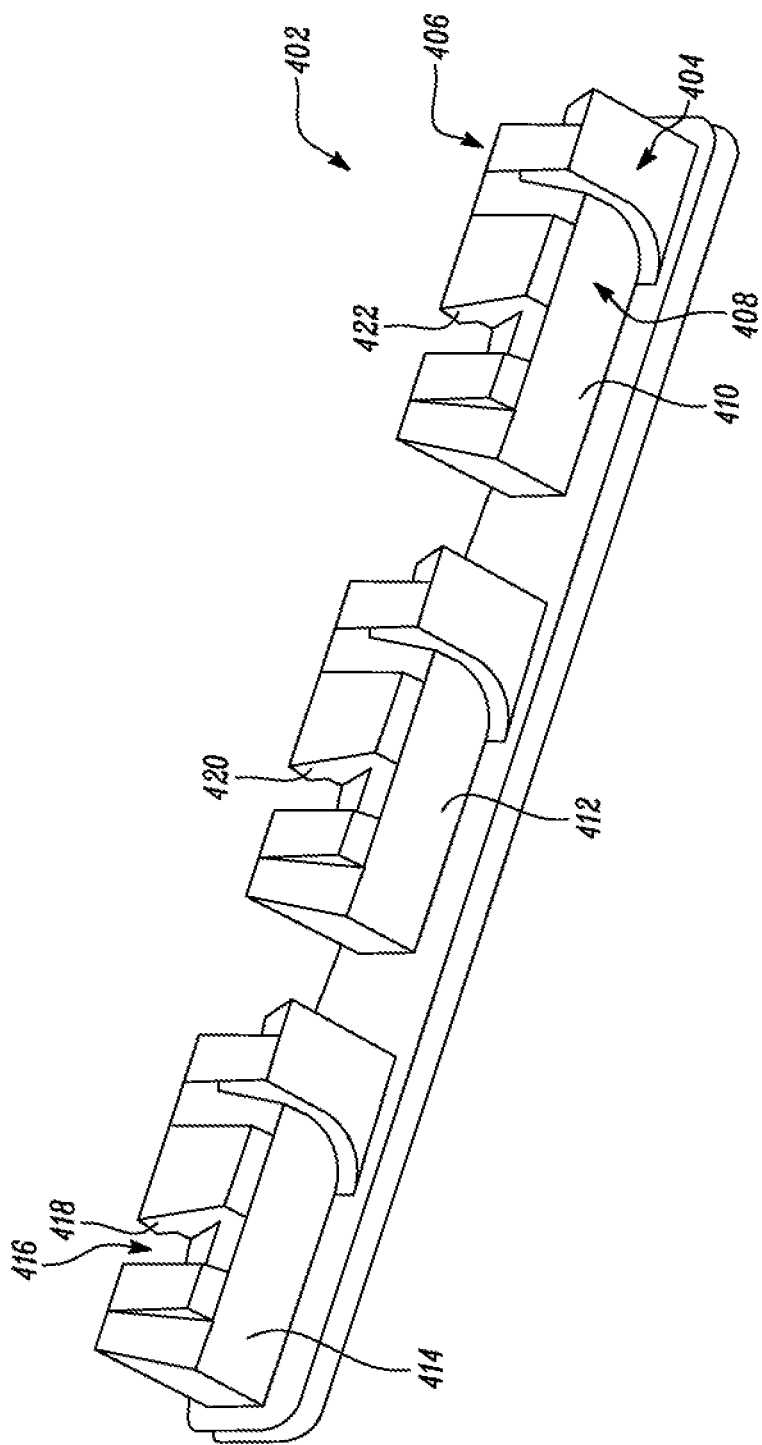
FIG. 5 is another perspective view of the first insert of FIG. 4, according to an embodiment of the present disclosure.

Referring to FIGS. 4 and 5, the first insert 402 includes a substantially elongated configuration defining a first side 404 and a second side 406. The second side 406 is opposite to the first side 404. The first insert 402 includes a plurality of first end passages 408. Each of the plurality of first end passages 408 is spaced apart with respect to one another. Also, each of the plurality of first end passages 408 include a substantially angled C-shaped configuration extending between the first side 404 and the second side 406.

As illustrated in FIGS. 4 and 5, the plurality of first end passages 408 include three passages, such as a first connecting passage 410, a second connecting passage 412, and a third connecting passage 414. In some embodiments, the plurality of first end passages 408 may include any number of passages, based on the number of the second plurality of passages 220. The first insert 402 also includes a plurality of first end channels 416. Each of the plurality of first end channels 416 is spaced apart with respect to one another and with respect to each of the plurality of first end passages 408. Also, each of the plurality of first end channels 416 includes a substantially angled C-shaped configuration extending between the first side 404 and the second side 406. In some implementations, the plurality of first end channels 416 include three channels, such as a first connecting channel 418, a second connecting channel 420, and a third connecting channel 422.

The first connecting channel 418 is spaced apart and inverted with respect to the third connecting passage 414. Also, the second connecting channel 420 is spaced apart and inverted with respect to the second connecting passage 412. Further, the third connecting channel 422 is spaced apart and inverted with respect to the first connecting passage 410. In some embodiments, the plurality of first end channels 416 may include any number of channels, based on the number of the first plurality of passages 206.

Figure 6:
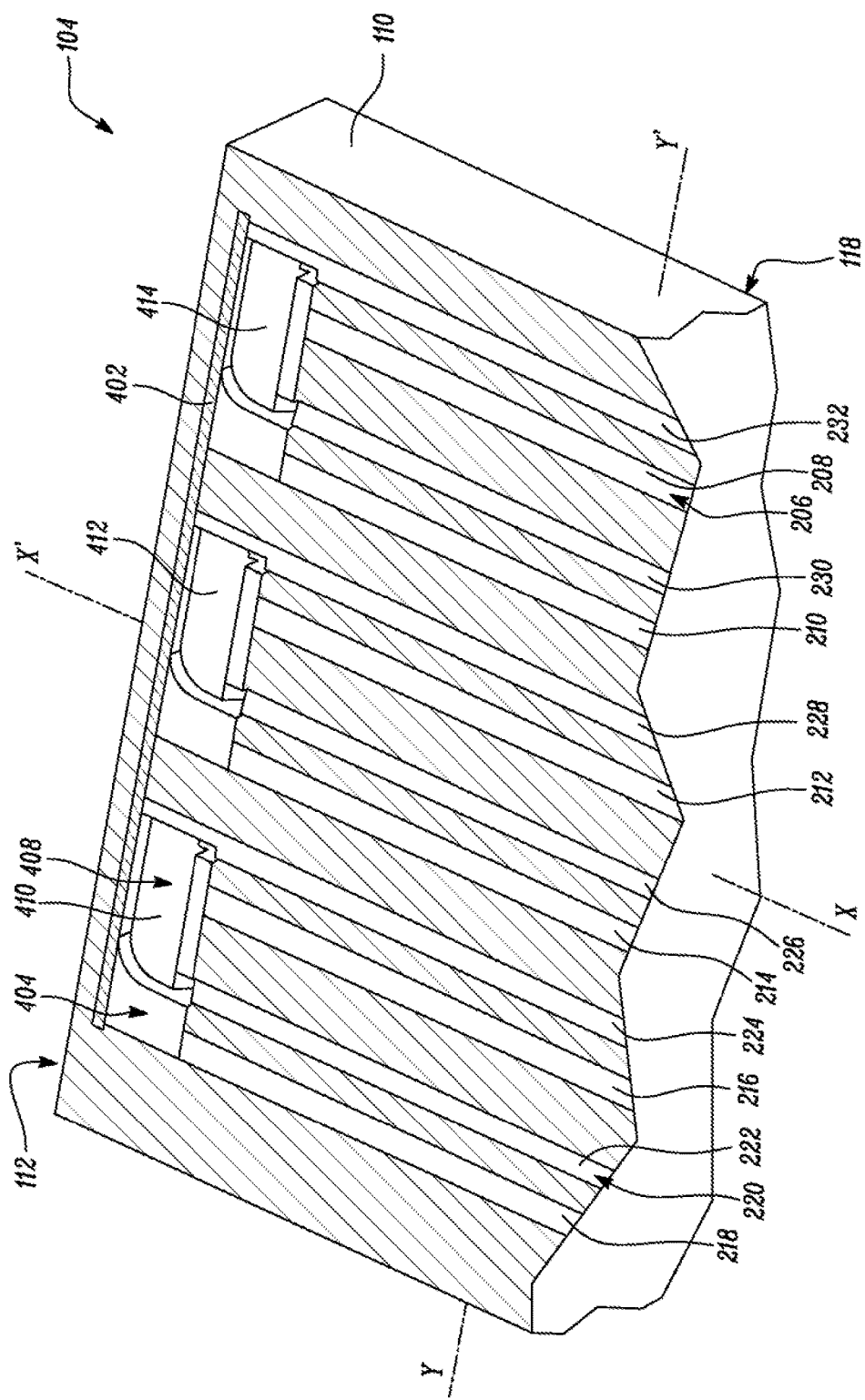
FIG. 6 is a partial perspective cross-sectional view of a portion of the heat sink assembly of FIG. 2 with the first insert of FIG. 4 coupled thereto, according to an embodiment of the present disclosure.

Referring to FIG. 6, in an installed position of the first insert 402 on the first end 112 of the main body 110, the first connecting passage 410 is adapted to provide a fluid passage or fluid communication between the seventh passage 222 and the eighth passage 224. Also, the second connecting passage 412 is adapted to provide fluid communication between the ninth passage 226 and the tenth passage 228. Further, the third connecting passage 414 is adapted to provide fluid communication between the eleventh passage 230 and the twelfth passage 232.

Figure 7:
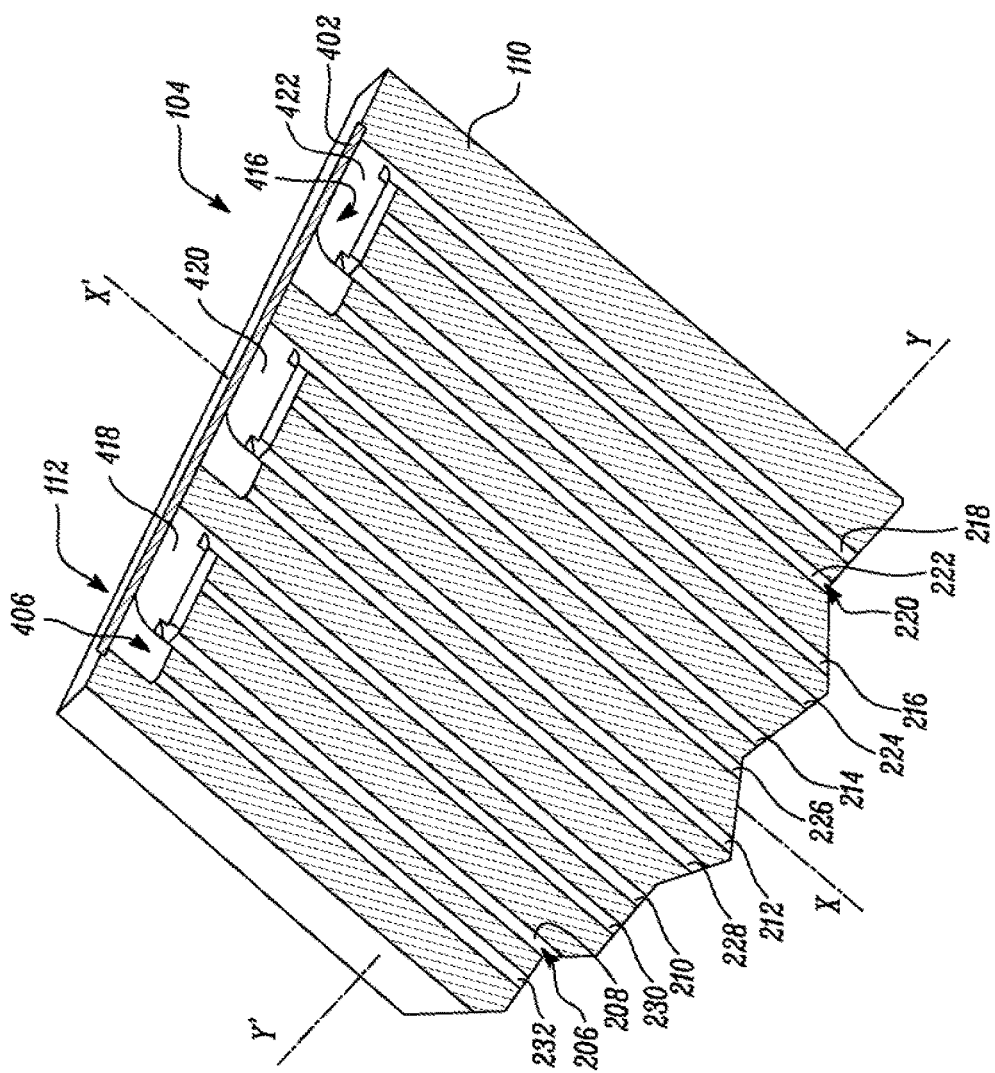
FIG. 7 is another partial perspective cross-sectional view of the portion of the heat sink assembly of FIG. 6, according to an embodiment of the present disclosure.

Referring to FIG. 7, in the installed position of the first insert 402 on the first end 112 of the main body 110, the first connecting channel 418 is adapted to provide fluid communication between the first passage 208 and the second passage 210. Also, the second connecting channel 420 is adapted to provide fluid communication between the third passage 212 and the fourth passage 214. Further, the third connecting channel 422 is adapted to provide fluid communication between the fifth passage 216 and the sixth passage 218.

The first insert 402 is adapted to be coupled to the first end 112 of the main body 110 via the first machined surface 202. More specifically, the first insert 402 is adapted to be coupled to the first end 112 of the main body 110 in a manner such that the first side 404 abuts the first surface 116 of the main body 110, and the second side 406 abuts the second surface 118 of the main body 110. Accordingly, the plurality of first end passages 408 and the plurality of first end channels 416 may be disposed within the main body 110. In some embodiments, the first insert 402 may be welded to the first end 112 of the main body 110 using any method, such as Friction Stir Welding (FSW).

Additionally, or alternatively, the first insert 402 may be coupled to the first end 112 of the main body 110 using one or more fastening elements not shown), such as screws, bolts, pins, clamps, clips, seals, and/or the like. The first insert 402 may be manufactured using any metal or alloy, such as aluminum, copper, steel, and/or the like. The first insert 402 may be manufactured using any method, such as casting, machining, fabrication, additive manufacturing, and/or the like. In some embodiments, the first insert 402 may be integrally manufactured with the main body 110. In such a situation, the first insert 402 may be integral with respect to the main body 110 forming a single piece component.

Figure 8:
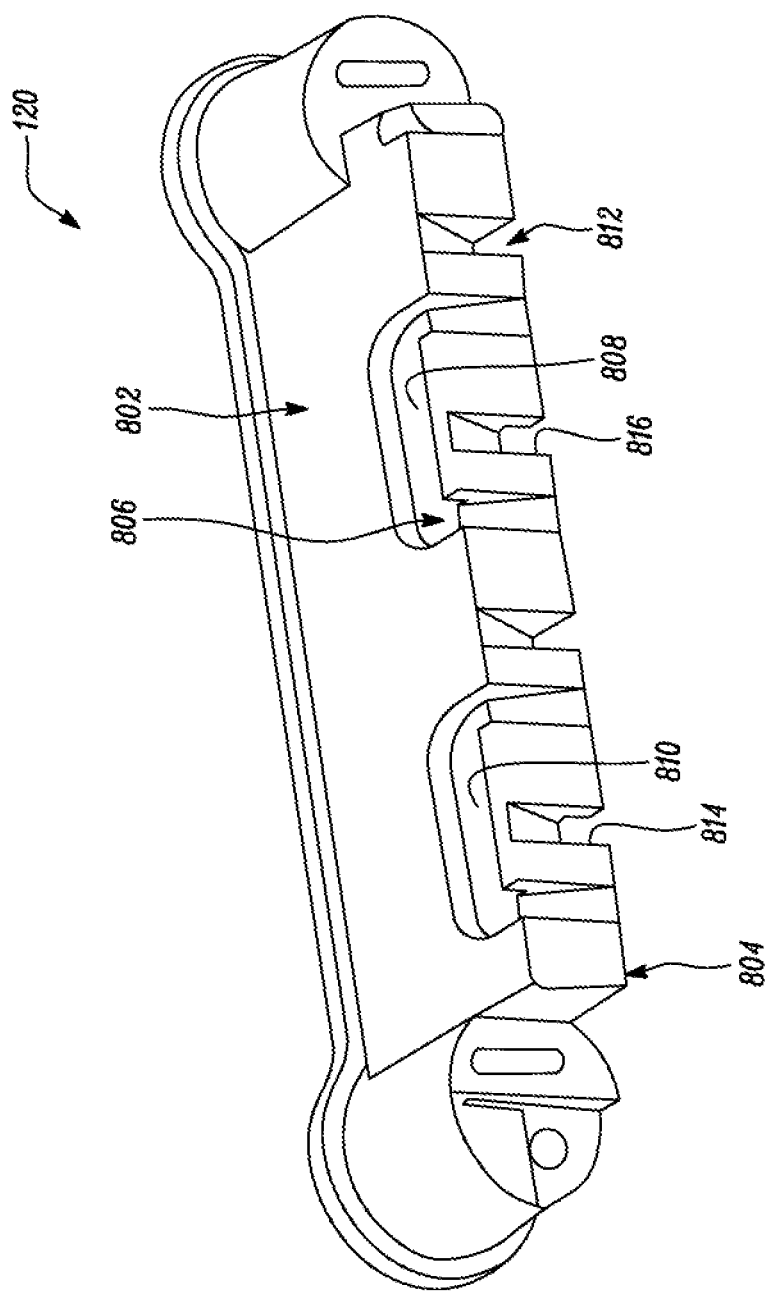
FIG. 8 is a perspective view of a second insert of the heat sink assembly of FIG. 1, according to an embodiment of the present disclosure.
Figure 9:
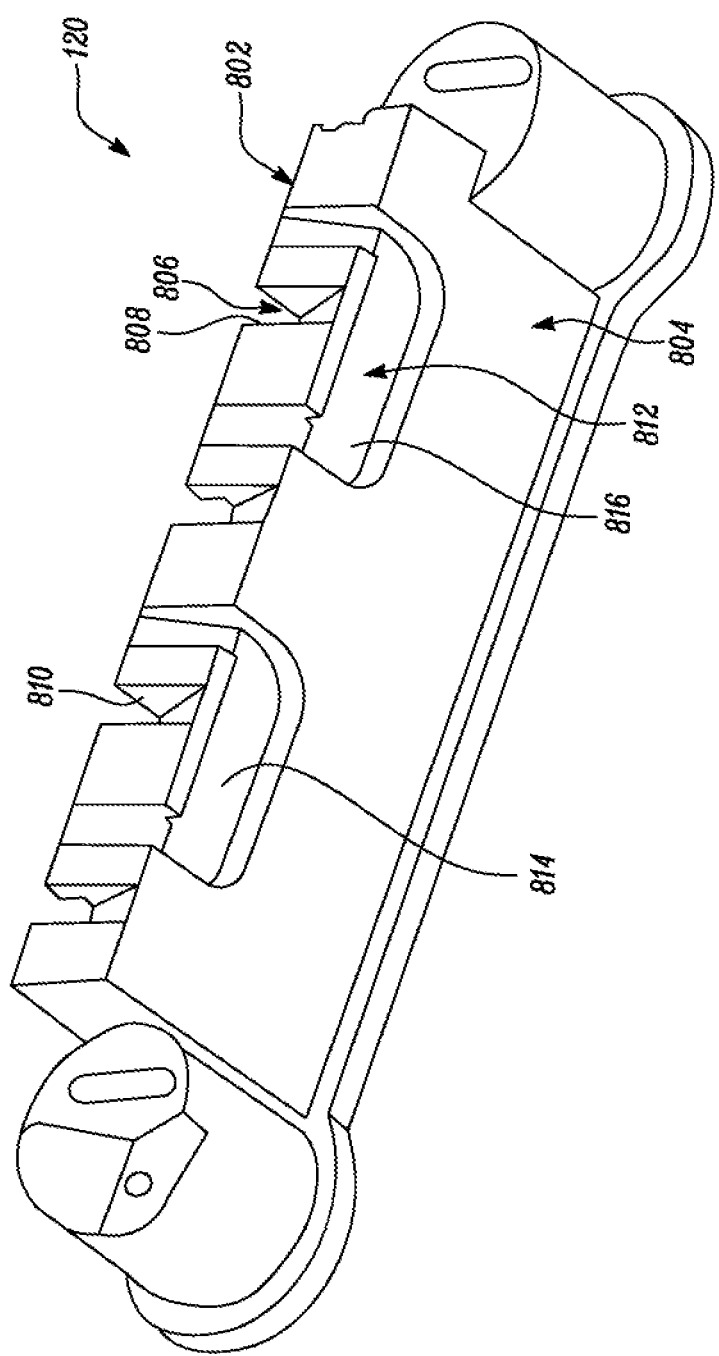
FIG. 9 is another perspective view of the second insert of FIG. 8, according to an embodiment of the present disclosure.

Referring to FIGS. 8 and 9, the second insert 120 includes a substantially elongated configuration defining a first side 802 and a second side 804. The second side 804 is opposite to the first side 802. The second insert 120 includes a plurality of second end passages 806. Each of the plurality of second end passages 806 is spaced apart with respect to one another. Also, each of the plurality of second end passages 806 include a substantially angled C-shaped configuration extending between the first side 802 and the second side 804.

As illustrated in FIGS. 8 and 9, the plurality of second end passages 806 include two passages, such as a fourth connecting passage 808 and a fifth connecting passage 810. In some embodiments, the plurality of second end passages 806 may include any number of passages, based on the number of the second plurality of passages 220.

The second insert 120 also includes a plurality of second end channels 812. Each of the plurality of second end channels 812 is spaced apart with respect to one another and each of the plurality of second end passages 806. Also, each of the plurality of second end channels 812 include a substantially angled C-shaped configuration extending between the first side 802 and the second side 804. As illustrated in FIGS. 8 and 9, the plurality of second end channels 812 include two channels, such as a fourth connecting channel 814 and a fifth connecting channel 816.

The fourth connecting channel 814 is spaced apart and inverted with respect to the fifth connecting passage 810. Also, the fifth connecting channel 816 is spaced apart and inverted with respect to the fourth connecting passage 808. In some embodiments, the plurality of second end channels 812 may include any number of channels, based on the number of the first plurality of passages 206.

Figure 10:
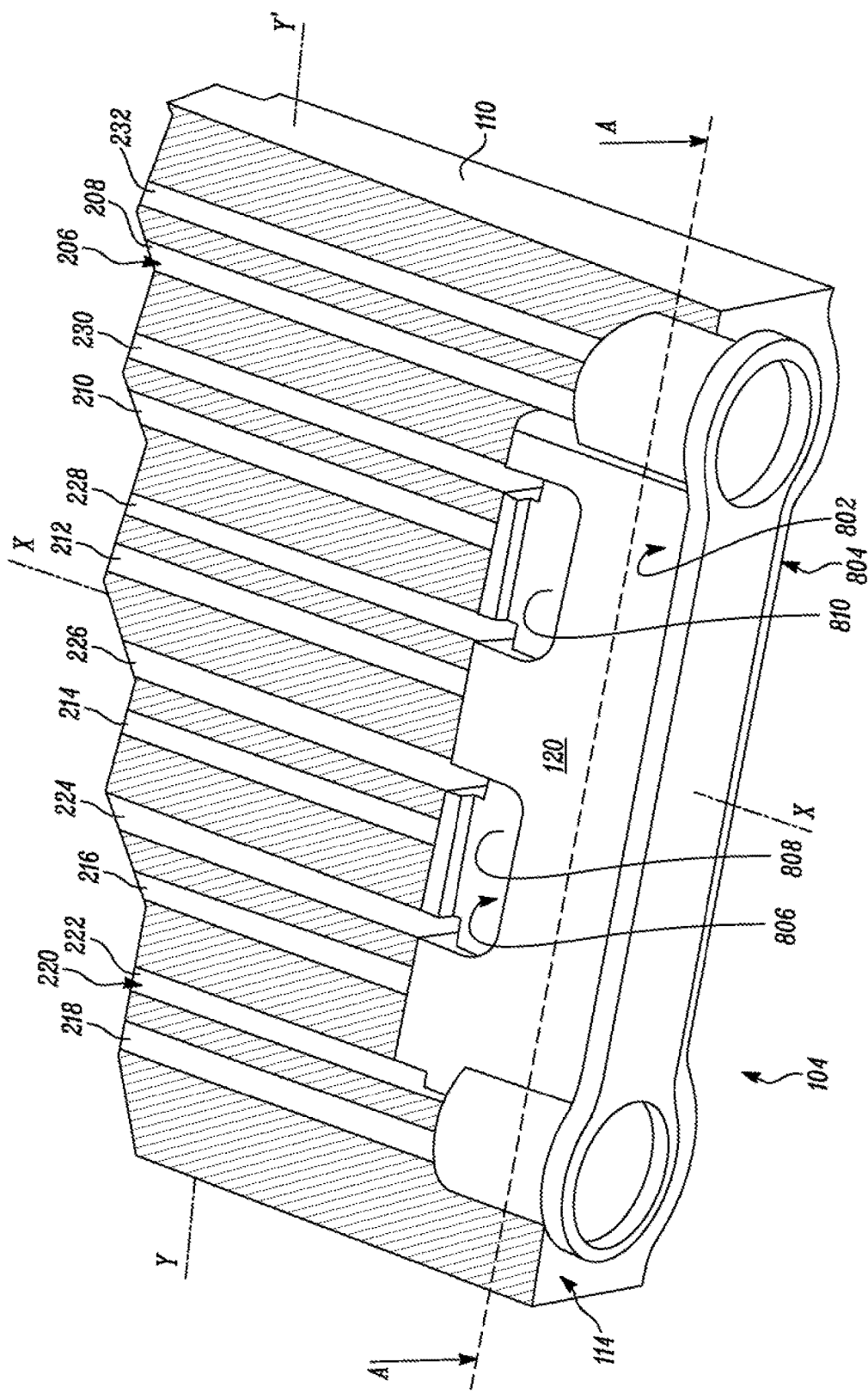
FIG. 10 is a partial perspective cross-sectional view of a portion of the heat sink assembly of FIG. 3 with the second insert of FIG. 8 coupled thereto showing a section A-A', according to an embodiment of the present disclosure.

Referring to FIG. 10, in an installed position of the second insert 120 on the second end 114 of the main body 110, the fourth connecting passage 808 is adapted to provide fluid communication between the eighth passage 224 and the ninth passage 226. Also, the fifth connecting passage 810 is adapted to provide fluid communication between the tenth passage 228 and the eleventh passage 230.

Figure 11:
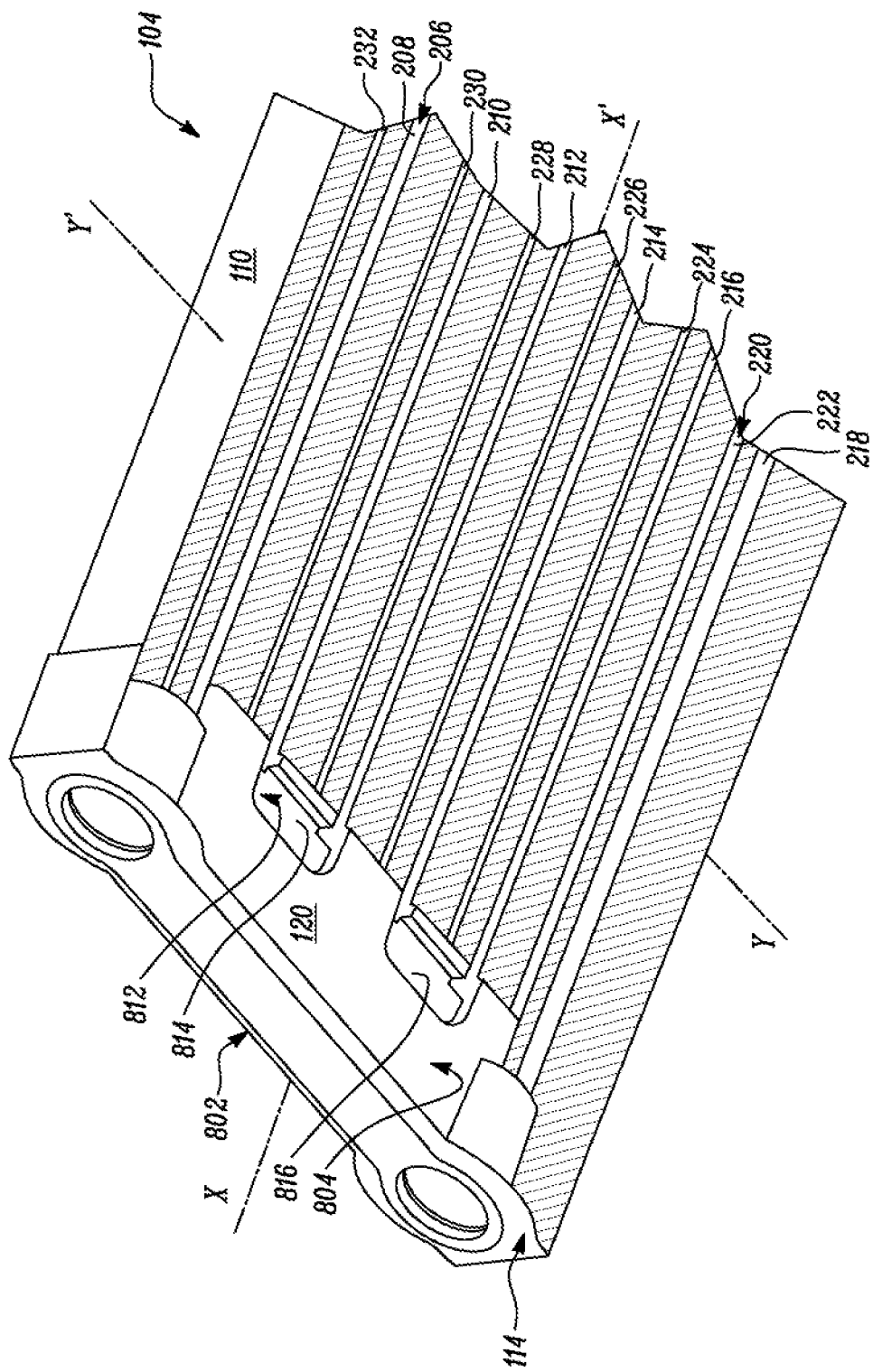
FIG. 11 is another partial perspective cross-sectional view of the portion of the heat sink assembly of FIG. 10, according to an embodiment of the present disclosure.

Referring to FIG. 11, in the installed position of the second insert 120 on the second end 114 of the main body 110, the fourth connecting channel 814 is adapted to provide fluid communication between the second passage 210 and the third passage 212. Also, the fifth connecting channel 816 is adapted to provide fluid communication between the fourth passage 214 and the fifth passage 216.

Figure 12:
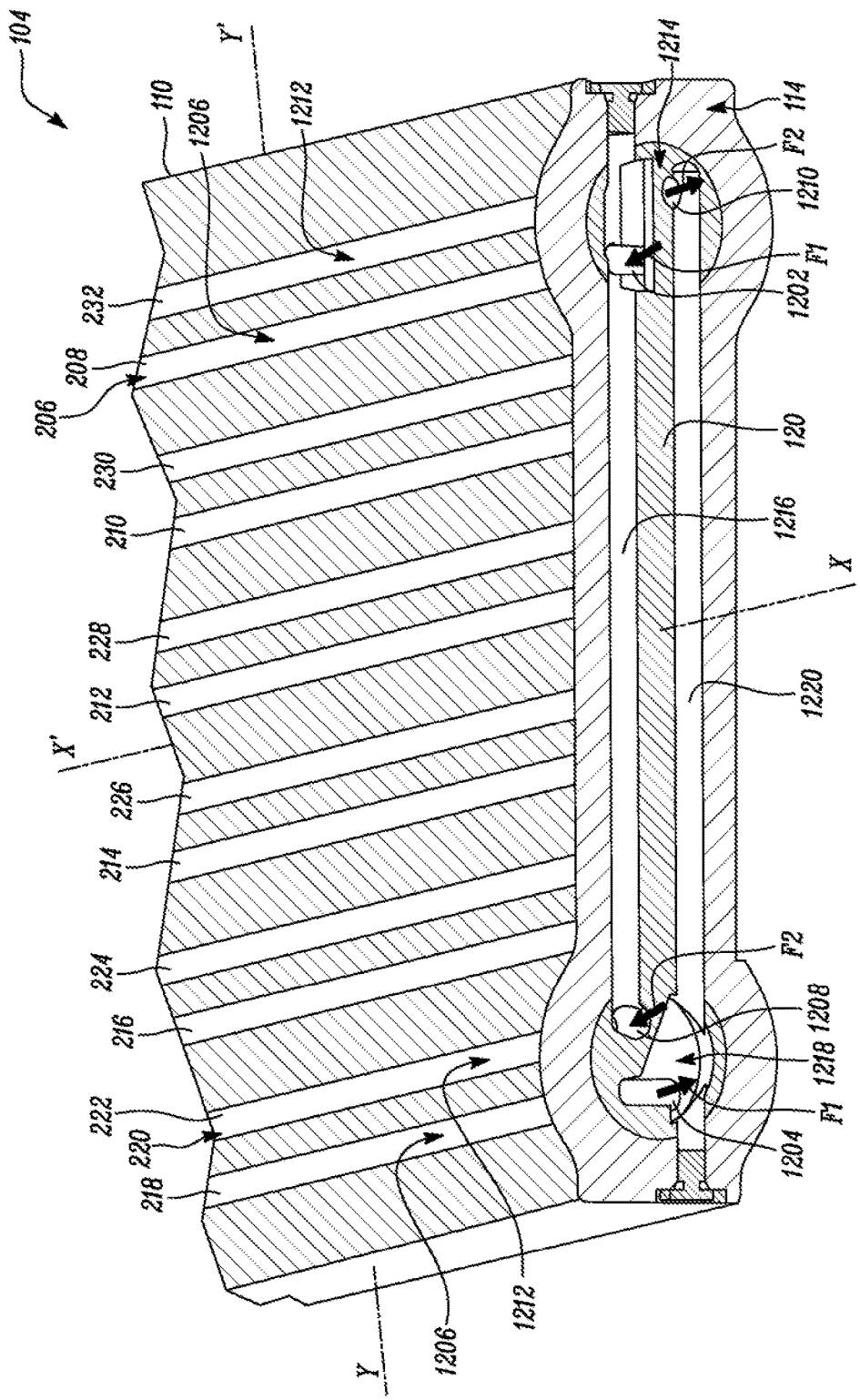
FIG. 12 is another partial perspective cross-sectional view of the heat sink assembly along the section A-A' of FIG. 10, according to an embodiment of the present disclosure.
Figure 13:
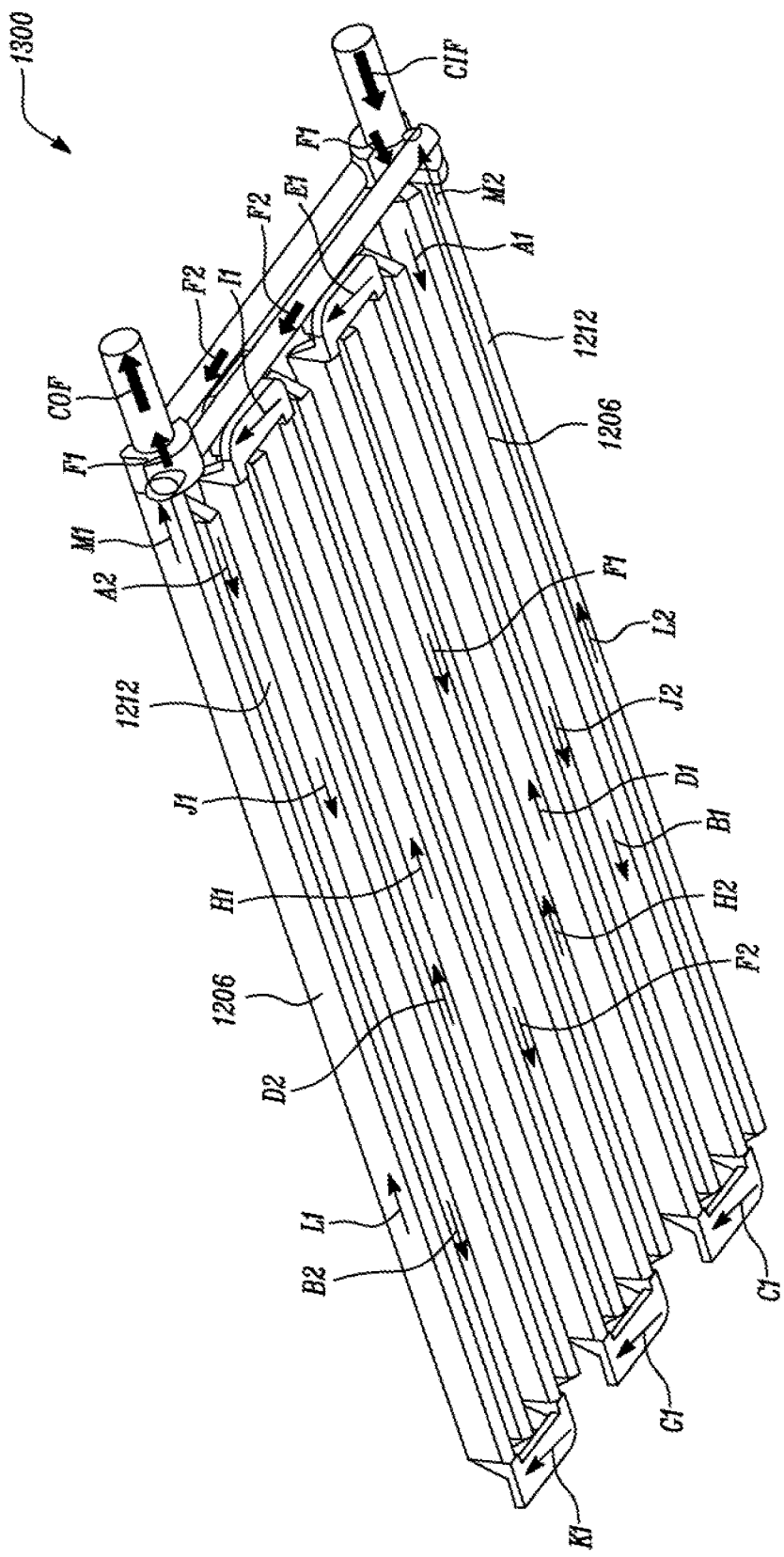
FIG. 13 is a perspective view of a fluid flow model of the heat sink assembly of FIG. 1, according to an embodiment of the present disclosure.
Figure 14:
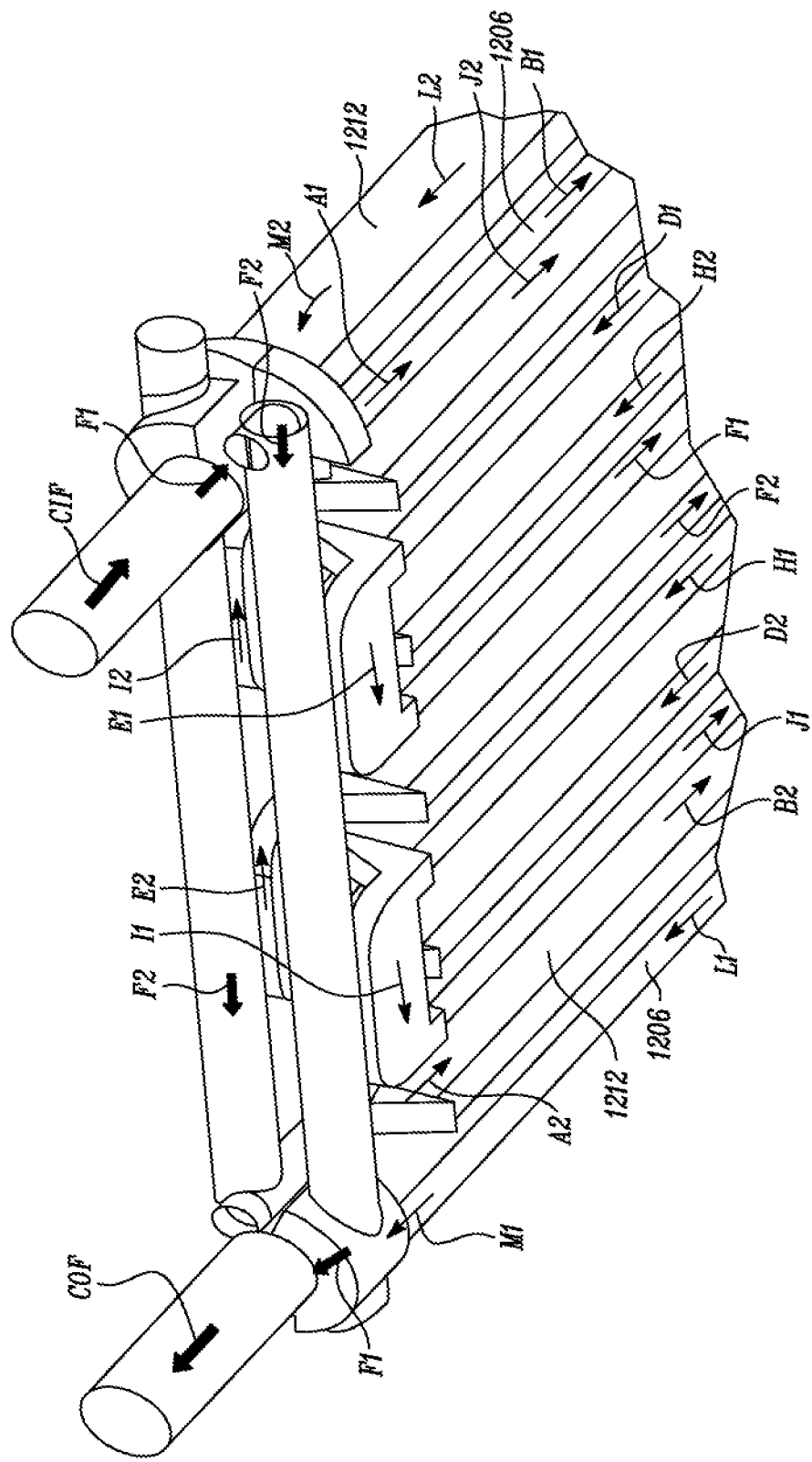
FIG. 14 is a perspective view of a portion of the fluid flow model of FIG. 13, according to an embodiment of the present disclosure.
Figure 15:
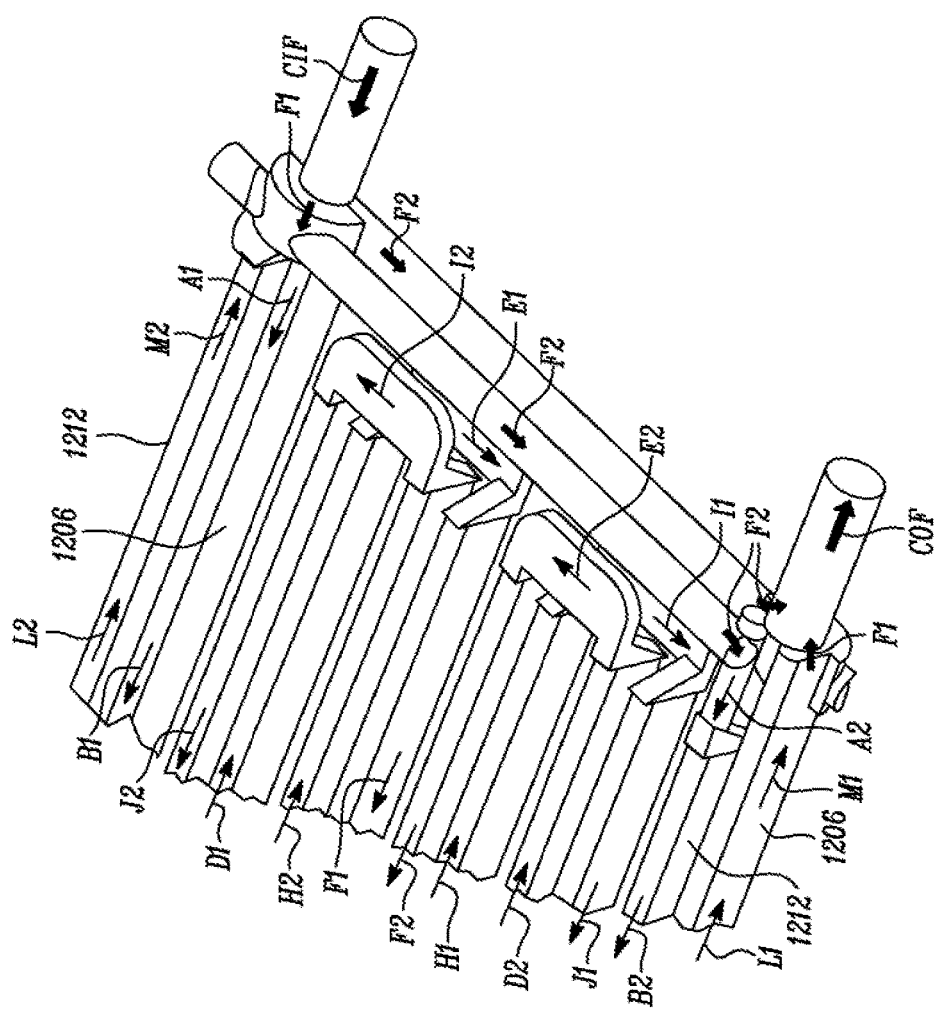
FIG. 15 is another perspective view of the portion of the fluid flow model of FIG. 14, according to an embodiment of the present disclosure.
Figure 16:
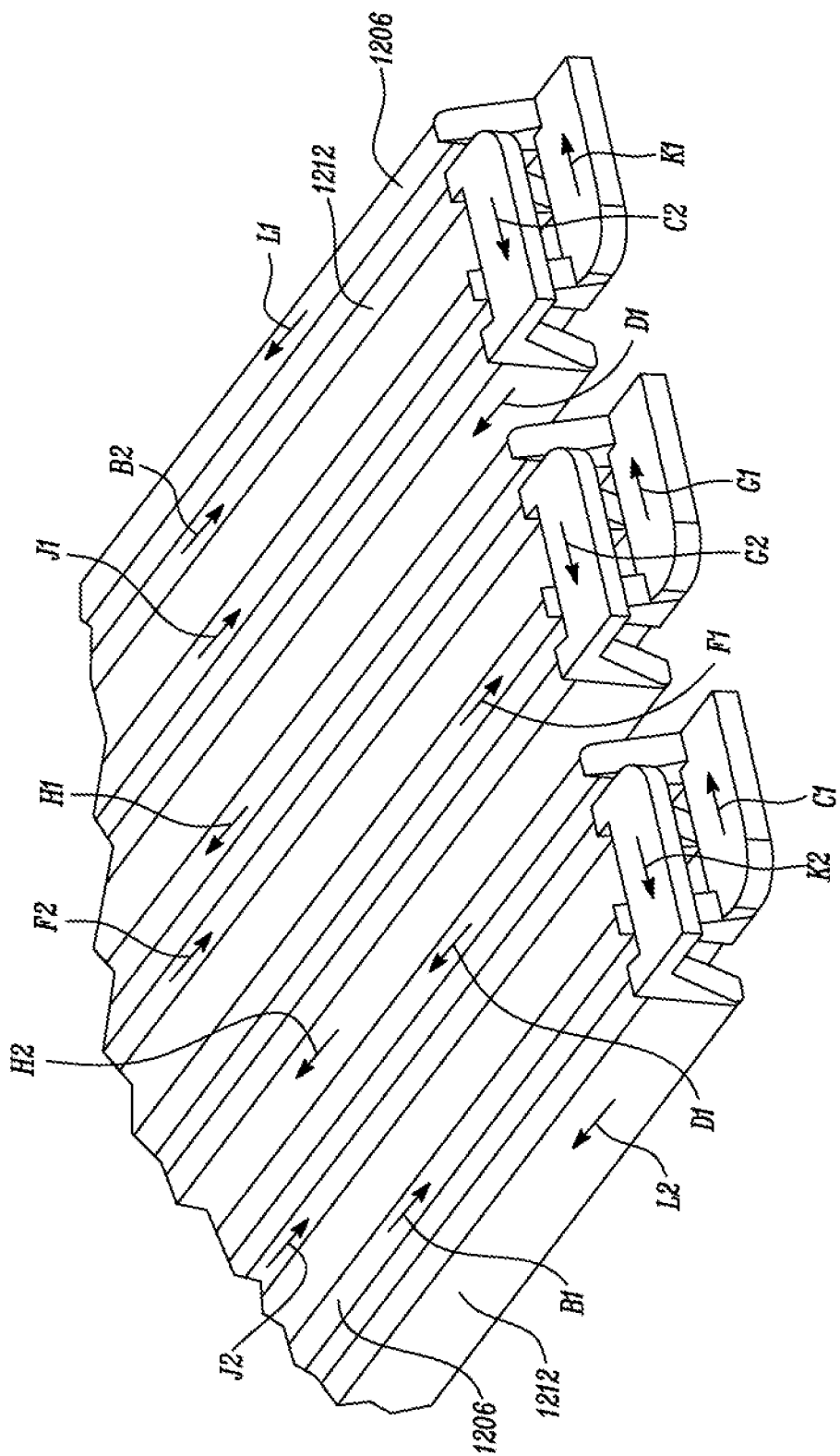
FIG. 16 is a perspective view of another portion of the fluid flow model of FIG. 13, according to an embodiment of the present disclosure.

Referring to FIG. 12, the main body 110 includes a first inlet 1202 to provide fluid communication to one of the first plurality of passages 206 at the second end 114 of the main body 110. More specifically, the first inlet 1202 is provided in association with the first passage 208 at the second end 114 of the main body 110. The main body 110 also includes a first outlet 1204 to provide fluid communication to one of the first plurality of passages 206 at the second end 114 of the main body 110. More specifically, the first outlet 1204 is provided in association with the sixth passage 218 at the second end 114 of the main body 110. The first outlet 1204 is spaced apart with respect to the first inlet 1202 along the transverse axis Y-Y'.

In the assembled position of the first insert 402 and the second insert 120 with respect to the main body 110, the first inlet 1202, the first passage 208, the first connecting channel 418, the second passage 210, the fourth connecting channel 814, the third passage 212, the second connecting channel 420, the fourth passage 214, the fifth connecting channel 816, the fifth passage 216, the third connecting channel 422, the sixth passage 218, and the first outlet 1204 define a first cooling circuit 1206 within the main body 110. The first cooling circuit 1206 is adapted to provide a first flow "F1" of a coolant through the main body 110.

The main body 110 also includes a second inlet 1208 to provide fluid communication to one of the second plurality of passages 220 at the second end 114 of the main body 110. More specifically, the second inlet 1208 is provided in association with the seventh passage 222 at the second end 114 of the main body 110. The second inlet 1208 is provided adjacent to and spaced apart with respect to the first outlet 1204 along the transverse axis Y-Y'. The main body 110 also includes a second outlet 1210 to provide fluid communication to one of the second plurality of passages 220 at the second end 114 of the main body 110. More specifically, the second outlet 1210 is provided in association with the twelfth passage 232 at the second end 114 of the main body 110. The second outlet 1210 is spaced apart with respect to the second inlet 1208 along the transverse axis Y-Y'. Also, the second outlet 1210 is adjacent to and spaced apart with respect to the first inlet 1202 alone the transverse axis Y-Y'.

In the assembled position of the first insert 402 and the second insert 120 with respect to the main body 110, the second inlet 1208, the seventh passage 222, the first connecting passage 410, the eighth passage 224, the fourth connecting passage 808, the ninth passage 226, the second connecting passage 412, the tenth passage 228, the fifth connecting passage 810, the eleventh passage 230, the third connecting passage 414, the twelfth passage 232, and the second outlet 1210 define a second cooling circuit 1212 within the main body 110. The second cooling circuit 1212 is adapted to provide a second flow "F2" of the coolant through the main body 110.

Accordingly, each of the first cooling circuit 1206 and the second cooling circuit 1212 is adapted to provide a serpentine flow of the coolant (i.e., the first flow "F1" and the second flow "F2," respectively) through the main body 110 respectively. Also, a direction of the first flow "F1" is opposite to a direction of the second flow "F2" of the coolant through the main body 110. As such, combination of the first cooling circuit 1206 and the second cooling circuit 1212 is adapted to provide a cross flow of the first flow "F1" and the second flow "F2" of the coolant through the main body 110 respectively.

In some embodiments (not shown), the first inlet 1202 and the second inlet 1208 may be provided in fluid communication with an outlet (not shown) of a coolant pump (not shown). Accordingly, the first cooling circuit 1206 and the second cooling circuit 1212 may receive the first flow "F1" and the second flow "F2" of the coolant respectively from the coolant pump. Also, the first outlet 1204 and the second outlet 1210 may be provided in fluid communication with an inlet (not shown) of the coolant pump. Accordingly, the coolant pump may receive the first flow "F1" and the second flow "F2" of the coolant from the first cooling circuit 1206 and the second cooling circuit 1212 respectively. The coolant may be any cooling fluid, such as a water-based coolant, an oil-based coolant, an ethylene-based coolant, a glycol-based coolant, and/or the like.

As illustrated in FIG. 12, the second insert 120 includes a fluid inlet 1214. The fluid inlet 1214 may be provided in fluid communication with the outlet of the coolant pump. Accordingly, the fluid inlet 1214 is adapted to receive a coolant inflow "CIF" from the outlet of the coolant pump. Also, the second insert 120 includes an inlet passage 1216 provided in fluid communication with the fluid inlet 1214. The inlet passage 1216 is further provided in fluid communication with the first inlet 1202 and the second inlet 1208. Accordingly, the inlet passage 1216 directs the coolant inflow "CIF" received through the fluid inlet 1214, into the first flow "F1" and the second flow "P2". Also, the inlet passage 1216 directs the first flow "F1" and the second flow "F2" into the first inlet 1202 and the second inlet 1208 respectively.

Also, the second insert 120 includes a fluid outlet 1218. The fluid outlet 1218 may be provided in fluid communication with the inlet of the coolant pump. Also, the second insert 120 includes an outlet passage 1220 provided in fluid communication with the fluid outlet 1218. The outlet passage 1220 is further provided in fluid communication with the first outlet 1204 and the second outlet 1210. Accordingly, the outlet passage 1220 merges the first flow "F1" and the second flow "F2" received from the first outlet 1204 and the second outlet 1210 into a coolant outflow "COF". Also, the fluid outlet 1218 directs the coolant outflow "COF" further into the inlet of the coolant pump.

The second insert 120 is adapted to be coupled to the second end 114 of the main body 110 via the second machined surface 302. More specifically, the second insert 120 is adapted to be coupled to the second end 114 of the main body 110 in a manner such that the first side 802 abuts the first surface 116 of the main body 110, and the second side 804 abuts the second surface 118 of the main body 110. Accordingly, the plurality of second end passages 806 and the plurality of second end channels 812 may be disposed within the math body 110. In some embodiments, the second insert 120 may be welded to the second end 114 of the main body 110 using any method, such as Friction Stir Welding (FSW).

In some embodiments, the second insert 120 may be coupled to the second end 114 of the main body 110 using one or more fastening elements, such as screws, bolts, pins, clamps, clips, seals, and/or the like. The second insert 120 may be manufactured using any metal or alloy, such as aluminum, copper, steel, and/or the like. The second insert 120 may be manufactured using any method, such as casting, machining, fabrication, additive manufacturing, and/or the like. In some embodiments, the second insert 120 may be integrally manufactured with the main body 110. In such a situation, the second insert 120 may be integral with respect to the main body 110 forming a single piece component.

INDUSTRIAL APPLICABILITY

The present disclosure provides the heat sink assembly 104 including the first cooling circuit 1206 and the second cooling circuit 1212 adapted for cross flow of the first flow "F1" and the second flow "F2" of the coolant. Referring to FIGS. 13, 14, 15, and 16, a fluid flow model 1300 of the first cooling circuit 1206 and the second cooling circuit 1212 is illustrated. It should be noted that the fluid flow model 1300 illustrates a flow path of each of the first flow "F1" and the second flow "F2" through the first cooling circuit 1206 and the second cooling circuit 1212 without any elements of the assembly 104 shown for the purpose of clarity and explanation.

The coolant inflow "CIF" is received from the outlet of the coolant pump through the fluid inlet 1214. Further, the coolant inflow "CIF" is divided into the first flow "F1" and the second flow "F2" by the inlet passage 1216. The first flow "F1" is received into the first cooling circuit 1206 through the first inlet 1202, as shown by path "A1". Path "B1" shows flow of the first flow "F1" through the first passage 208. Path "C1" shows flow of the first flow "F1" through the first connecting channel 418. Path "D1" shows flow of the first flow "F1" through the second passage 210. Path "E1" shows flow of the first flow "F1" through the fourth connecting channel 814. Path "F1" shows flow of the first flow "F1" through the third passage 212.

Further, path "G1" shows flow of the first flow "F1" through the second connecting channel 420. Path "H1" shows flow of the first flow "F1" through the fourth passage 214. Path "I1" shows flow of the first flow "F1" through the fifth connecting channel 816. Path "J1" shows flow of the first flow "F1" through the fifth passage 216. Path "K1" shows flow of the first flow "F1" through the third connecting channel 422. Path "L1" shows flow of the first flow "F1" through the sixth passage 218. The first flow "F1" is flown out of the first cooling circuit 1206 through the first outlet 1204, as shown by path "M1".

Also, the second flow "F2" is received into the second cooling circuit 1212 through the first inlet 1202, as shown by path "A2". Path "B2" shows flow of the second flow "F2" through the second passage 210. Path "C2" shows flow of the second flow "F2" through the second connecting channel 420. Path "D2" shows flow of the second flow "F2" through the second passage 210. Path "E2" shows flow of the second flow "F2" through the fourth connecting channel 814. Path "F2" shows flow of the second flow "F2" through the third passage 212.

Further, path "G2" shows flow of the second flow "F2" through the second connecting channel 420. Path "H2" shows flow of the second flow "F2" through the fourth passage 214. Path "I2" shows flow of the second flow "F2" through the fifth connecting channel 816. Path "J2" shows flow of the second flow "F2" through the fifth passage 216. Path "K2" shows flow of the second flow "F2" through the third connecting channel 422. Path "L2" shows flow of the second flow "F2" through the sixth passage 218. The second flow "F2" is flown out of the second cooling circuit 1212 through the first outlet 1204, as shown by path "M2". The second flow "F2" is merged with the first flow "F1" using the outlet passage 1220 into the coolant outflow "COF". The coolant outflow "COF" is then directed out of the assembly 104 through the fluid outlet 1218, and further into the inlet of the coolant pump.

It should be noted that in some embodiments when the first inlet 1202 and the second inlet 1208 may be directly coupled to the outlet of the coolant pump, the assembly 104 may include dual inlets in the firm of the first inlet 1202 and the second inlet 1208 in order to receive the first flow "F1" and the second flow "F2" respectively. In such a situation, the fluid inlet 1214 and the inlet passage 1216 may be omitted. Similarly, when the first outlet 1204 and the second outlet 1210 may be directly coupled to the inlet of the coolant pump, the assembly 104 may include dual outlets in the form of the first outlet 1204 and the second outlet 1210 in order to exit the first flow "F1" and the second flow "F2" respectively. In such a situation, the fluid outlet 1218 and the outlet passage 1220 may be omitted.

The first cooling circuit 1206 and the second cooling circuit 1212 provide two serpentine flow paths for the coolant within the main body 110. The serpentine flow paths provide high coolant velocity within the first cooling circuit 1206 and the second cooling circuit 1212, and increased cooling efficiency. Also, the first cooling circuit 1206 and the second cooling circuit 1212 provide flow of the first flow "F1" and the second flow "F2" of the coolant respectively in opposite directions, in turn, providing a balanced, cross flow of the coolant within the main body 110.

The cooler coolant flows into the main body 110 as the first flow "F1" and the second flow "F2" through the first inlet 1202 and the second inlet 1208 respectively, thus, providing two streams of the coolant. As such, the assembly 104 includes a footprint similar to that of a heat sink that may have a single cooling circuit, in turn, improving cooling efficiency. As the coolant flows through each of the first cooling circuit 1206 and the second cooling circuit 1212, heat is transferred from each of the power modules 102, through the first surface 116 and/or the second surface 118, to the first flow "F1" and the second flow "F2" of the coolant respectively. As a result, the assembly 104 provides two flow paths for the cool coolant through the main body 110, in turn, providing lower coolant temperatures within the respective cooling circuits, and uniform cooling of the assembly 104 with respect to the heat sink having the single cooling circuit.

The uniform cooling further provides to reduce a thermal gradient of each of the power modules 102 along the transverse axis Y-Y' and/or the longitudinal axis X-X' with respect to the heat sink having the single cooling circuit. The reduced thermal gradient may, in turn, limit premature failure of the one or more power modules 102 due to overheating of die junction as a result of poor current sharing, failure due to loss of gate control, premature wear out due to expansion fatigue resulting from excessive temperature changes, and/or the like.

The second insert 120 directs the coolant received from the outlet of the coolant pump into the first flow "F1" and the second flow "F2" using the inlet passage 1216. Also, the second insert 120 merges the first flow "F1" and the second flow "F2" received from the first outlet 1204 and the second outlet 1210 using the outlet passage 1220. As a result, the second insert 120 provides use of the single coolant pump for providing the coolant to each of the first cooling circuit 1206 and the second cooling circuit 1212, in turn, reducing system cost, maintenance cost, and/or the like. The assembly 104 may be retrofitted in any electronic/electrical system with minimal or no changes to the existing system. Also, existing heat sinks may be converted into the assembly 104 with simple design and manufacturing modifications and may be fabricated using conventional methods, in turn, reducing development cost, manufacturing cost, tooling cost, and/or the like.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of the disclosure. Such embodiments should be understood to fall within the scope of the present disclosure as determined based upon the claims and any equivalents thereof.

No element/component, act/action performed by any element/component, or instruction used herein should be construed as critical or essential unless explicitly described as such. Additionally, the phrase "based on" is intended to mean "based, at least in part, on" unless explicitly stated otherwise. Furthermore, the articles "a" and "an," as used herein, are intended to include one or more items, and may be used interchangeably with "one or more." In the event only one item is intended, the term "one" or similar language is used. Moreover, the terms "has," "have," "having," or the like, as also used herein, are intended to be open-ended terms.

What is claimed is:

1. A heat sink assembly for a power module, the heat sink assembly comprising:
  a main body having a first end and a second end, the second end being longitudinally opposite the first end;
  a first cooling circuit disposed within the main body, the first cooling circuit adapted to provide a first flow of a coolant through the main body, the first cooling circuit including:
    a first plurality of passages disposed within the main body and extending between the first end and the second end of the main body, each of the first plurality of passages being parallel to and spaced apart with respect to one another;
    at least one first end channel disposed within the main body at the first end of the main body, the at least one first end channel adapted to provide fluid communication between each of the first plurality of passages at the first end of the main body;
    at least one second end channel disposed within the main body at the second end of the main body, the at least one second end channel adapted to provide fluid communication between each of the first plurality of passages at the second end of the main body;
    a first inlet provided in fluid communication with one of the first plurality of passages at the second end of the main body; and
    a first outlet provided in fluid communication with one of the first plurality of passages at the second end of the main body, the first outlet being spaced apart with respect to the first inlet; and
  a second cooling circuit disposed within the main body, the second cooling circuit adapted to provide a second flow of the coolant through the main body, the second cooling circuit including:
    a second plurality of passages disposed within the main body and extending between the first end and the second end of the main body, each of the second plurality of passages being parallel to and spaced apart with respect to one another and with respect to each of the first plurality of passages;

at least one first end passage disposed within the main body at the first end of the main body, the at least one first end passage being spaced apart with respect to the at least one first end channel, the at least one first end passage adapted to provide fluid communication between each of the second plurality of passages at the first end of the main body;

at least one second end passage disposed within the main body at the second end of the main body, the at least one second end passage being spaced apart with respect to the at least one second end channel, the at least one second end passage adapted to provide fluid communication between each of the second plurality of passages at the second end of the main body;

a second inlet provided in fluid communication with one of the second plurality of passages at the second end of the main body, the second inlet being adjacent to and spaced apart with respect to the first outlet; and a second outlet provided in fluid communication with one of the second plurality of passages at the second end of the main body, the second outlet being adjacent to and spaced apart with respect to the first inlet, wherein the first cooling circuit and the second cooling circuit provide an opposing cross flow of the first flow and the second flow through the main body respectively; and wherein the at least one first end channel and the at least one first end passage are disposed within a first insert adapted to be coupled to the first end of the main body.

2. The heat sink assembly of claim 1, wherein the at least one second end channel and the at least one second end passage are disposed within a second insert adapted to be coupled to the second end of the main body.

3. The heat sink assembly of claim 2, wherein the second insert further includes:
a fluid inlet; and
an inlet passage adapted to provide fluid communication between the fluid inlet and each of the first inlet and the second inlet.

4. The heat sink assembly of claim 2, wherein the second insert further includes:
a fluid outlet; and
an outlet passage adapted to provide fluid communication between the fluid outlet and each of the first outlet and the second outlet.

5. The heat sink assembly of claim 2, wherein at least one of:
the first insert is welded to the first end of the main body, or
the second insert is welded to the second end of the main body.

6. The heat sink assembly of claim 2, wherein at least one of the main body, the first insert, or the second insert is manufactured using at least one of extrusion, casting, machining, or additive manufacturing.

7. The heat sink assembly of claim 1, wherein:
the at least one first end channel includes a plurality of first end channels, each of the plurality of first end channels being spaced apart with respect to one another, and
the at least one first end passage includes a plurality of first end passages, each of the plurality of first end passages being spaced apart with respect to one another and with respect to each of the plurality of first end channels.

8. The heat sink assembly of claim 1, wherein:
the at least one second end channel includes a plurality of second end channels, each of the plurality of second end channels being spaced apart with respect to one another, and
the at least one second end passage includes a plurality of second end passages, each of the plurality of second end passages being spaced apart with respect to one another and with respect to each of the plurality of second end channels.

9. The heat sink assembly of claim 1, wherein the main body further includes a first surface and a second surface opposite to the first surface, each of the first surface and the second surface extending between the first end and the second end of the main body, wherein at least one of the first surface or the second surface is adapted to receive the power module and transfer heat from the power module.

10. A heat sink assembly for a power module, the heat sink assembly comprising:
a main body having a first end and a second end, the second end being longitudinally opposite the first end, the main body including:
a first plurality of passages extending between the first end and the second end of the main body, each of the first plurality of passages being parallel to and spaced apart with respect to one another;
a second plurality of passages extending between the first end and the second end of the main body, each of the second plurality of passages being parallel to and spaced apart with respect to one another and with respect to each of the first plurality of passages;
a first inlet provided in fluid communication with one of the first plurality of passages at the second end of the main body;
a first outlet provided in fluid communication with one of the first plurality of passages at the second end of the main body, the first outlet being spaced apart with respect to the first inlet;
a second inlet provided in fluid communication with one of the second plurality of passages at the second end of the main body, the second inlet being adjacent to and spaced apart with respect to the first outlet; and
a second outlet provided in fluid communication with one of the second plurality of passages at the second end of the main body, the second outlet being adjacent to and spaced apart with respect to the first inlet;
a first insert adapted to be coupled to the first end of the main body, the first insert including:
at least one first end channel adapted to provide fluid communication between each of the first plurality of passages at the first end of the main body; and
at least one first end passage being spaced apart with respect to the at least one first end channel, the at least one first end passage adapted to provide fluid communication between each of the second plurality of passages at the first end of the main body; and
a second insert adapted to be coupled to the second end of the main body, the second insert including:
at least one second end channel adapted to provide fluid communication between each of the first plurality of passages at the second end of the main body;
at least one second end passage being spaced apart with respect to the at least one second end channel, the at least one second end passage adapted to provide fluid communication between each of the second plurality of passages at the second end of the main body;

a fluid inlet adapted to provide fluid communication with each of the first inlet and the second inlet; and
a fluid outlet adapted to provide fluid communication with each of the first outlet and the second outlet,
wherein the first inlet, the first plurality of passages, the at least one first end channel, the at least one second end channel, and the first outlet define a first cooling circuit, and the second inlet, the second plurality of passages, the at least one first end passage, the at least one second end passage, and the second outlet define a second cooling circuit, and
wherein the first cooling circuit and the second cooling circuit provide a cross flow of a first flow of a coolant and a second flow of the coolant through the main body respectively.

11. The heat sink assembly of claim 10, wherein the second insert further includes:
an inlet passage adapted to provide fluid communication between the fluid inlet and each of the first inlet and the second inlet; and
an outlet passage adapted to provide fluid communication between the fluid outlet and each of the first outlet and the second outlet.

12. The heat sink assembly of claim 10, wherein:
the at least one first end channel includes a plurality of first end channels, each of the plurality of first end channels being spaced apart with respect to one another; and
the at least one first end passage includes a plurality of first end passages, each of the plurality of first end passages being spaced apart with respect to one another and with respect to each of the plurality of first end channels.

13. The heat sink assembly of claim 10, wherein:
the at least one second end channel includes a plurality of second end channels, each of the plurality of second end channels being spaced apart with respect to one another; and
the at least one second end passage includes a plurality of second end passages, each of the plurality of second end passages being spaced apart with respect to one another and with respect to each of the plurality of second end channels.

14. The heat sink assembly of claim 10, wherein the main body further includes a first surface and a second surface opposite to the first surface, each of the first surface and the second surface extending between the first end and the second end of the main body, wherein at least one of the first surface or the second surface is adapted to receive the power module and transfer heat from the power module.

15. The heat sink assembly of claim 10, wherein a direction of the first flow of the coolant is opposite to a direction of the second flow of the coolant.

16. The heat sink assembly of claim 10, wherein at least one of the main body, the first insert, or the second insert is manufactured using at least one of extrusion, casting, machining, or additive manufacturing.

17. A heat sink assembly for a power converter device, the heat sink assembly comprising:
a main body having a first end and a second end, the second end being longitudinally opposite the first end;
a first cooling circuit disposed within the main body, the first cooling circuit adapted to provide a first flow of a coolant through the main body, the first cooling circuit including:
a first plurality of passages disposed within the main body and extending between the first end and the second end of the main body, each of the first plurality of passages being parallel to and spaced apart with respect to one another;
at least one first end channel disposed within the main body at the first end of the main body, the at least one first end channel adapted to provide fluid communication between each of the first plurality of passages at the first end of the main body;
at least one second end channel disposed within the main body at the second end of the main body, the at least one second end channel adapted to provide fluid communication between each of the first plurality of passages at the second end of the main body;
a first inlet provided in fluid communication with one of the first plurality of passages at the second end of the main body; and
a first outlet provided in fluid communication with one of the first plurality of passages at the second end of the main body, the first outlet being spaced apart with respect to the first inlet; and
a second cooling circuit disposed within the main body, the second cooling circuit adapted to provide a second flow of the coolant through the main body, the second cooling circuit including:
a second plurality of passages disposed within the main body and extending between the first end and the second end of the main body, each of the second plurality of passages being parallel to and spaced apart with respect to one another and with respect to each of the first plurality of passages;
at least one first end passage disposed within the main body at the first end of the main body, the at least one first end passage being spaced apart with respect to the at least one first end channel, the at least one first end passage adapted to provide fluid communication between each of the second plurality of passages at the first end of the main body;
at least one second end passage disposed within the main body at the second end of the main body, the at least one second end passage being spaced apart with respect to the at least one second end channel, the at least one second end passage adapted to provide fluid communication between each of the second plurality of passages at the second end of the main body;
a second inlet provided in fluid communication with one of the second plurality of passages at the second end of the main body, the second inlet being adjacent to and spaced apart with respect to the first outlet; and
a second outlet provided in fluid communication with one of the second plurality of passages at the second end of the main body, the second outlet being adjacent to and spaced apart with respect to the first inlet,
wherein the first cooling circuit and the second cooling circuit provide an opposing cross flow of the first flow and the second flow through the main body respectively; and
wherein the at least one first end channel and the at least one first end passage are disposed within a first insert adapted to be coupled to the first end of the main body.

18. The power converter device of claim 17, wherein the at least one second end channel and the at least one second end passage are disposed within a second insert adapted to be coupled to the second end of the main body.

* * * * *